United States Patent
Hoang et al.

(10) Patent No.: US 10,638,608 B2
(45) Date of Patent: Apr. 28, 2020

(54) INTERCONNECT FRAMES FOR SIP MODULES

(71) Applicant: Apple Inc., Cupertino, CA (US)

(72) Inventors: Lan H. Hoang, San Jose, CA (US); Raghunandan R. Chaware, Sunnyvale, CA (US); Chang Liu, San Jose, CA (US); Takayoshi Katahira, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,469

(22) Filed: Sep. 28, 2018

(65) Prior Publication Data

US 2019/0082538 A1    Mar. 14, 2019

Related U.S. Application Data

(63) Continuation-in-part of application No. 15/699,946, filed on Sep. 8, 2017, now abandoned.

(51) Int. Cl.
| | |
|---|---|
| *H05K 7/10* | (2006.01) |
| *H05K 7/12* | (2006.01) |
| *H05K 1/14* | (2006.01) |
| *H05K 1/11* | (2006.01) |
| *H05K 1/18* | (2006.01) |
| *H05K 1/02* | (2006.01) |

(Continued)

(52) U.S. Cl.
CPC ............ *H05K 1/144* (2013.01); *B23Q 1/015* (2013.01); *H01R 12/7005* (2013.01); *H01R 12/716* (2013.01); *H01R 12/73* (2013.01); *H05K 1/0243* (2013.01); *H05K 1/111* (2013.01); *H05K 1/181* (2013.01); *H01R 43/26* (2013.01); *H05K 2201/042* (2013.01); *H05K 2201/1031* (2013.01); *H05K 2201/10287* (2013.01); *H05K 2201/2018* (2013.01)

(58) Field of Classification Search
CPC .. B23Q 1/015; H01R 12/7005; H01R 12/716; H01R 12/73; H01R 43/26; H05K 1/0243; H05K 1/111; H05K 1/144; H05K 1/181; H05K 2201/042; H05K 2201/10287; H05K 2201/1031; H05K 2201/2018
USPC .................................................. 361/767, 792
See application file for complete search history.

(56) References Cited

U.S. PATENT DOCUMENTS

| | | | |
|---|---|---|---|
| 5,556,286 A * | 9/1996 | Ikesugi | ................ H01R 12/716 439/74 |
| 5,646,373 A | 7/1997 | Collins | |

(Continued)

FOREIGN PATENT DOCUMENTS

| | | |
|---|---|---|
| JP | 2011514015 | 4/2011 |
| KR | 1020090022749 | 3/2009 |

(Continued)

OTHER PUBLICATIONS

U.S. Appl. No. 15/699,946, Final Office Action dated Apr. 4, 2019, 10 pages.

(Continued)

*Primary Examiner* — Yuriy Semenenko
(74) *Attorney, Agent, or Firm* — Kilpatrick Townsend & Stockton, LLP

(57) ABSTRACT

Frames and other structures for system-in-package modules that may allow components on boards in the modules to communicate with each other.

18 Claims, 39 Drawing Sheets

(51) Int. Cl.
*H01R 12/71* (2011.01)
*B23Q 1/01* (2006.01)
*H01R 12/70* (2011.01)
*H01R 12/73* (2011.01)
*H01R 43/26* (2006.01)

(56) References Cited

U.S. PATENT DOCUMENTS

| | | | |
|---|---|---|---|
| 7,896,657 B2 * | 3/2011 | Ono | H05K 3/368 |
| | | | 439/65 |
| 8,294,252 B1 | 10/2012 | Patel | |
| 9,831,579 B1 * | 11/2017 | Gomelsky | H01R 12/716 |
| 2002/0024408 A1 | 2/2002 | Iwata | |
| 2003/0165051 A1 | 9/2003 | Kledzik et al. | |
| 2005/0168961 A1 | 8/2005 | Ono | |
| 2006/0115928 A1 | 6/2006 | Nguyen et al. | |
| 2006/0163707 A1 | 7/2006 | Hooi | |
| 2008/0278922 A1 * | 11/2008 | Wimmer | G06F 21/86 |
| | | | 361/784 |
| 2009/0091897 A1 * | 4/2009 | Willing | H02M 7/003 |
| | | | 361/752 |
| 2009/0311884 A1 | 12/2009 | Ono et al. | |
| 2010/0330821 A1 * | 12/2010 | Takeuchi | H01R 13/26 |
| | | | 439/65 |
| 2011/0286194 A1 * | 11/2011 | Kawabata | H05K 1/141 |
| | | | 361/803 |
| 2012/0061814 A1 | 3/2012 | Camacho et al. | |
| 2012/0217624 A1 | 8/2012 | Morris et al. | |
| 2013/0223038 A1 | 8/2013 | Yamamoto et al. | |
| 2013/0241044 A1 | 9/2013 | Kim | |
| 2013/0343023 A1 | 12/2013 | Nakagoshi et al. | |
| 2014/0103527 A1 | 4/2014 | Marimuthu et al. | |
| 2014/0126159 A1 * | 5/2014 | Lin | H01L 21/561 |
| | | | 361/736 |
| 2014/0203457 A1 | 7/2014 | Kim et al. | |
| 2014/0264933 A1 | 9/2014 | Yu et al. | |
| 2015/0031221 A1 * | 1/2015 | Sloey | H05K 1/11 |
| | | | 439/66 |
| 2015/0187742 A1 | 7/2015 | Kwon et al. | |
| 2015/0200182 A1 | 7/2015 | Wang et al. | |
| 2015/0200185 A1 | 7/2015 | Yu et al. | |
| 2015/0206854 A1 | 7/2015 | Lane et al. | |
| 2015/0359099 A1 | 12/2015 | Pennathur et al. | |
| 2016/0315430 A1 * | 10/2016 | Takeuchi | H01R 12/707 |
| 2016/0351522 A1 * | 12/2016 | Vincent | H01L 25/105 |
| 2017/0127523 A1 * | 5/2017 | Fritz | H05K 1/0298 |
| 2018/0190596 A1 | 7/2018 | Chang | |

FOREIGN PATENT DOCUMENTS

WO 2013/095402 A1 6/2013
WO 2013/176426 A1 11/2013

OTHER PUBLICATIONS

U.S. Appl. No. 15/699,946, Non-Final Office Action dated Aug. 31, 2018, 10 pages.

\* cited by examiner

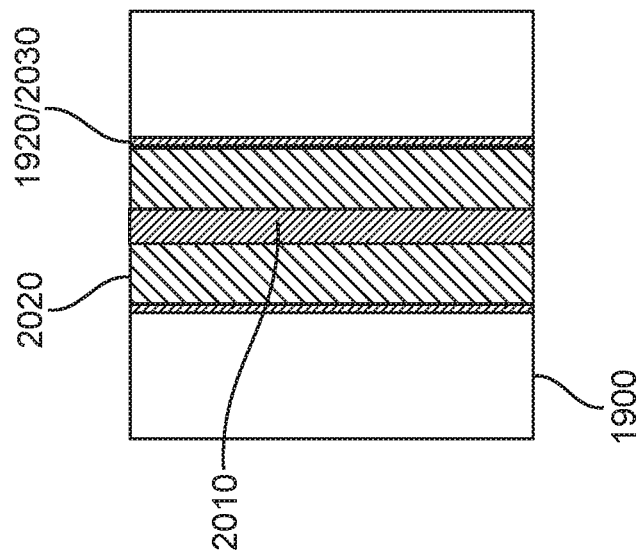
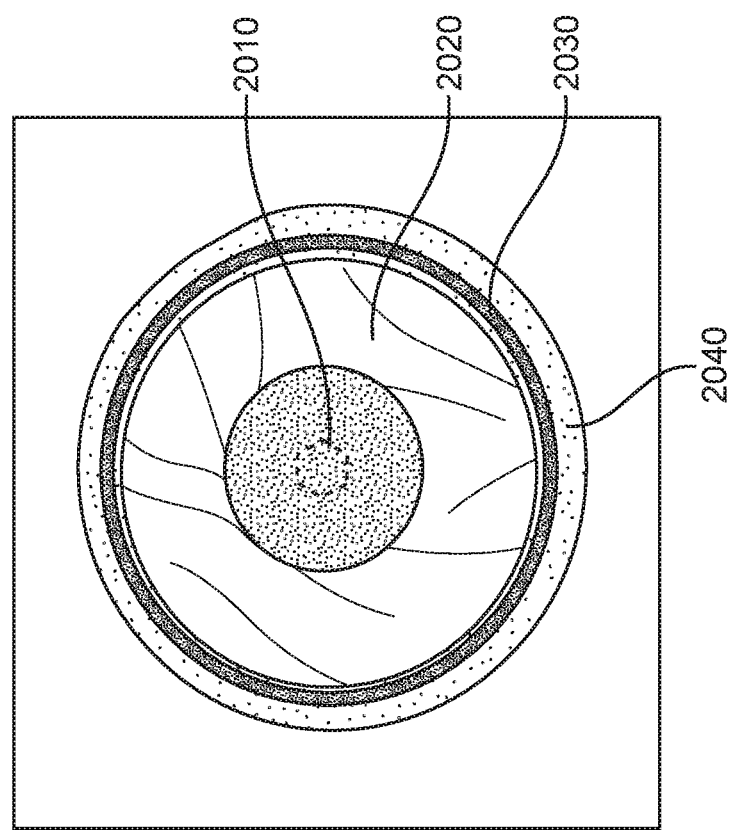
FIG. 20B
FIG. 20A

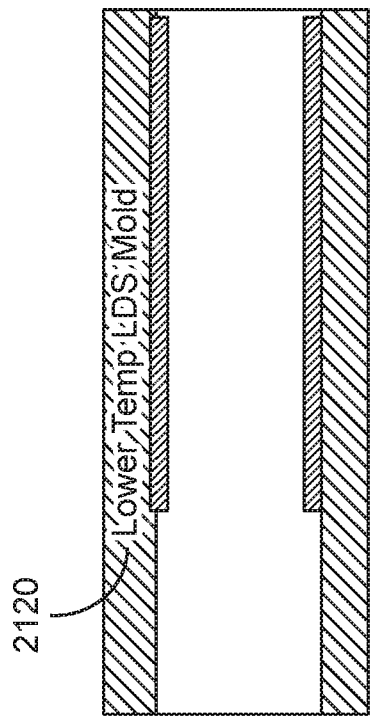
FIG. 21C
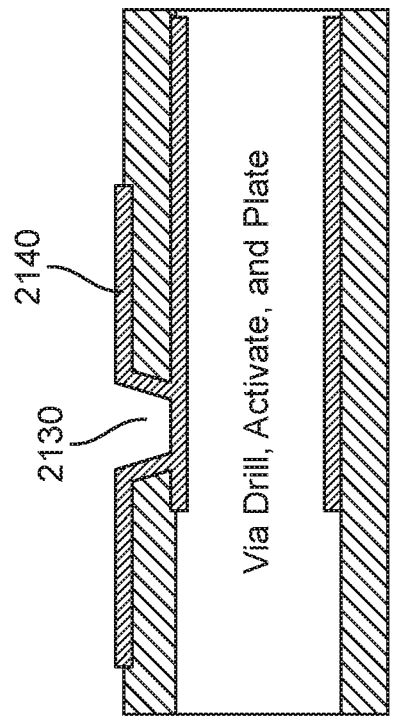
FIG. 21D
FIG. 21A
FIG. 21B

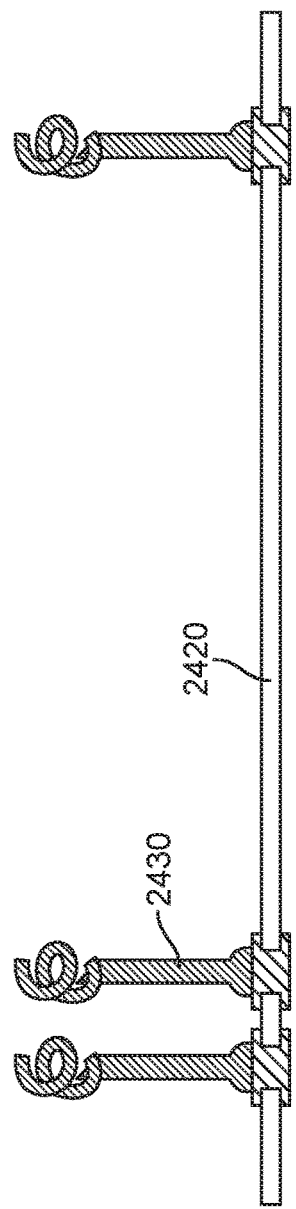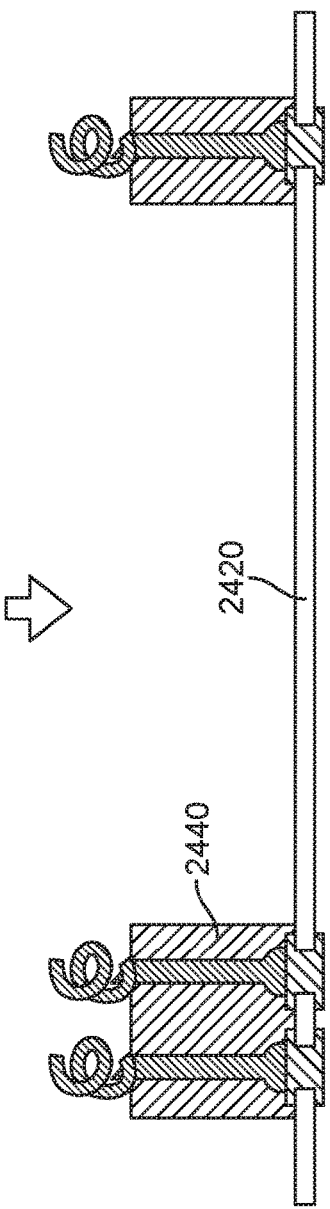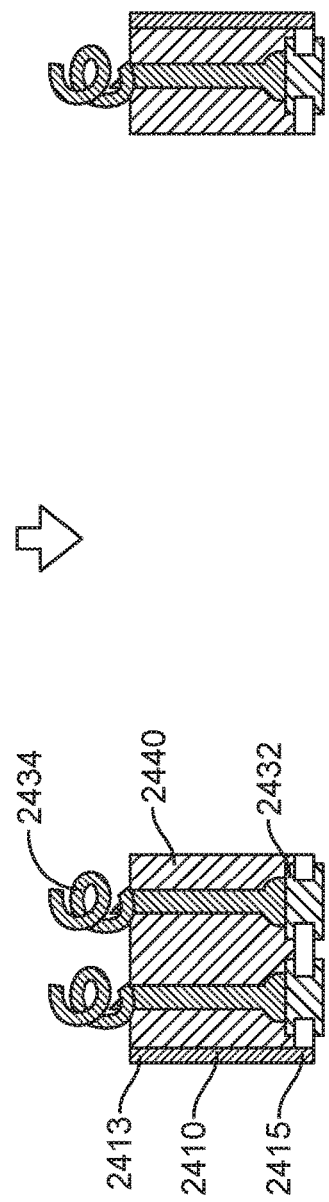

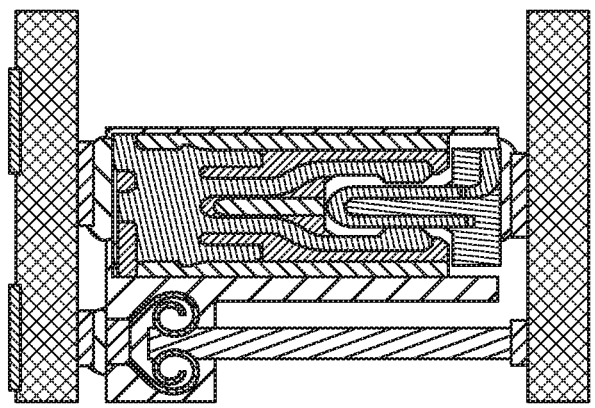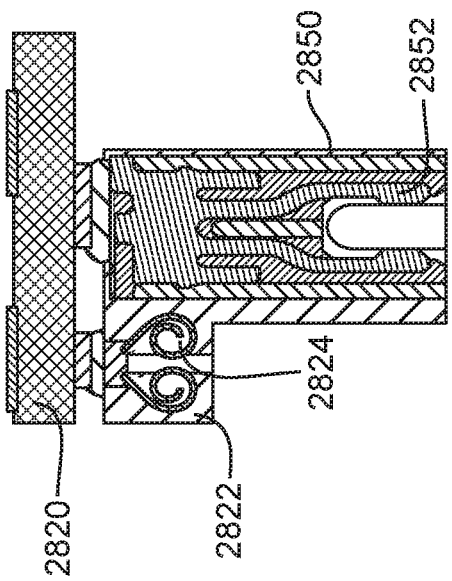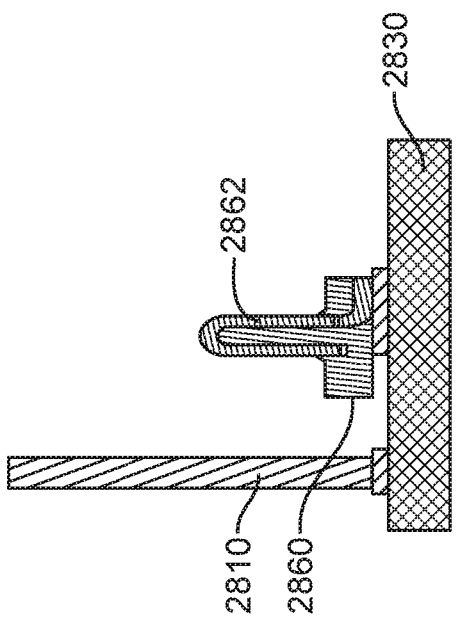
FIG. 28A
FIG. 28B
FIG. 28C

INTERCONNECT FRAMES FOR SIP MODULES

CROSS-REFERENCE TO RELATED APPLICATIONS

This application is a continuation-in-part of U.S. patent application Ser. No. 15/699,946, filed Sep. 8, 2017, which is incorporated by reference.

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, storage devices, portable media players, navigation systems, monitors, and others, have become ubiquitous.

The functionality of these devices has likewise greatly increased. This in turn has led to increased complexity inside of these electronic devices. At the same time, the dimensions of these devices have become smaller. For example, smaller and thinner devices are becoming more popular.

This increasing functionality and decreasing size have necessitated the use of space-efficient circuit manufacturing techniques. As one example, system-in-package (SIP) modules and other similar structures may be used to increase an electronic device's functionality while reducing space consumed in the device. Reducing the space consumed in a device allows additional functionality to be included in the device, allows the device to be smaller, or a combination thereof.

These system-in-package modules may include electronic devices or components placed on a board and then sealed and encapsulated in a plastic or other material. Other modules may include electronic devices or components placed on a first board and electronic devices or components placed on a second board. But it may be difficult for components on the two boards to communicate in this configuration.

Thus, what is needed are structures for modules that may allow components on separate boards in the modules to communicate with each other.

SUMMARY

Accordingly, embodiments of the present invention may provide structures for system-in-package modules that may allow components on boards in the modules to communicate with each other.

An illustrative embodiment of the present invention may provide a system-in-package module having two printed circuit boards facing each other. Specifically, one or more circuits or components may be located on a surface of a first printed circuit board. One or more circuits or components may be located on a surface of a second printed circuit board. The surfaces of these printed circuit boards may be encapsulated, either together or separately. The encapsulated portions may be adjacent such that the surfaces of the boards face each other with the components and encapsulation between them. One or more intermediate layers that may be used for shielding, grounding, heat spreading, or other reasons, may be located between the boards. The one or more intermediate layers may be formed of conductive metal or other material.

In conventional system-in-package modules, communication between a top printed circuit board and a bottom printed circuit board may be difficult. Accordingly, these and other embodiments of the present invention may provide a frame or interposer that may be located between the top printed circuit board and the bottom circuit board. This frame may be located around edges of one or both of the printed circuit boards. The frame may include other portions that are not located around edges of either printed circuit board. For example, the frame may include portions that traverse from one edge of a frame to another edge of a frame along a middle of a printed circuit board. These frames may provide mechanical support, shielding, signal pathways including radio-frequency and other high-speed signal pathways, printed circuit board alignment, and other features to the SIP modules.

These frames may provide several features. These features may include providing mechanical stability between two facing printed circuit boards of a SIP module. A frame may also provide a boundary for a potting or molding material during assembly. These features may include providing paths for power and signals. The frames may further include shielding for SIP modules, for example along an outside edge of the SIP module.

In these and other embodiments of the present invention, one or more of these features may be performed by one or more different structures. For example, a frame that does not include paths for power and signals may be used. This frame may be relatively thin as compared to a frame that does include these paths. This frame may be used for mechanical stability between two facing printed circuit boards, and a may provide a boundary for potting or molding material. This frame may also provide shielding along an outside of a SIP module. To compensate for the loss of power and signal paths in the frame, connectors may be used between two facing boards. A frame and connector may be formed as a unit, or the frame and connector may be formed separately. The combined space required by the thin frame and connectors may be smaller than a frame that includes both. These connectors may also allow a SIP module to be reworked during assembly.

In these and other embodiments of the present invention, these frames may be formed of metal, such as copper, copper nickel, copper titanium, aluminum, steel, or other copper alloy or other material. These frames may be stamped, middle injection molded, 3-D printed, or formed in other ways. These frames may be formed of plastic and plated or otherwise coated with a conductive material. A frame may extend as a single piece from a top board to a bottom board. In these and other embodiments of the present invention, a frame may be formed of two sections, where a first section is attached to a top board and a second section is attached to a bottom board. These two sections may have interlocking features and may be attached to each other during assembly of the SIP module.

It should be noted that while the interconnect structures described above are well-suited to forming system-in-package modules, in these and other embodiments of the present invention, other types of electronic devices may be formed using these techniques. Embodiments of the present invention may be used at different levels in the manufacturing of a SIP module. For example, a SIP module may be formed of one or more other sub-modules, and these embodiments of the present invention may be used in one or more of these sub-modules. The SIP module itself may be formed by employing one or more embodiments of the present invention.

In various embodiments of the present invention, contacts, interconnect paths, and other conductive portions of SIP modules may be formed by stamping, metal-injection molding, machining, micro-machining, ink jet, 3-D printing, aerosol jet printing, or other type of printing or manufacturing process. The conductive portions may be formed of stainless steel, steel, copper, copper titanium, aluminum, phosphor bronze, or other material or combination of materials. They may be plated or coated with nickel, gold, or other material. The nonconductive portions may be formed using injection or other molding, ink-jet, 3-D, aerosol-jet, or other type of printing, machining, or other manufacturing process. The nonconductive portions may be formed of silicon or silicone, rubber, hard rubber, plastic, nylon, liquid-crystal polymers (LCPs), plastic, epoxy, resin, or other nonconductive material or combination of materials. The printed circuit board or other appropriate substrates used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIGS. 19A-19I and 20A-20B illustrate methods of manufacturing a high-speed path according to an embodiment of the present invention;

FIGS. 21A-21D illustrate a method of forming interconnect according to an embodiment of the present invention;

FIGS. 24A-24C illustrate a method of manufacturing a frame and connector according to an embodiment of the present invention;

FIGS. 28A-28C illustrate a connector system according to an embodiment of the present invention;

DESCRIPTION OF EXEMPLARY EMBODIMENTS

An illustrative embodiment of the present invention may provide a system-in-package module having two printed circuit boards facing each other. Specifically, one or more circuits or components may be located on a surface of a first printed circuit board. One or more circuits or components may be located on a surface of a second printed circuit board. The surfaces of the ease printed circuit boards may be encapsulated, either together or separately. The encapsulated portions may be adjacent such that the surfaces of the boards face each other with the components and encapsulation between them. One or more intermediate layers that may be used for shielding, grounding, heat spreading, or other reasons may be located between the boards. An example is shown in the following figures.

Figure 1:
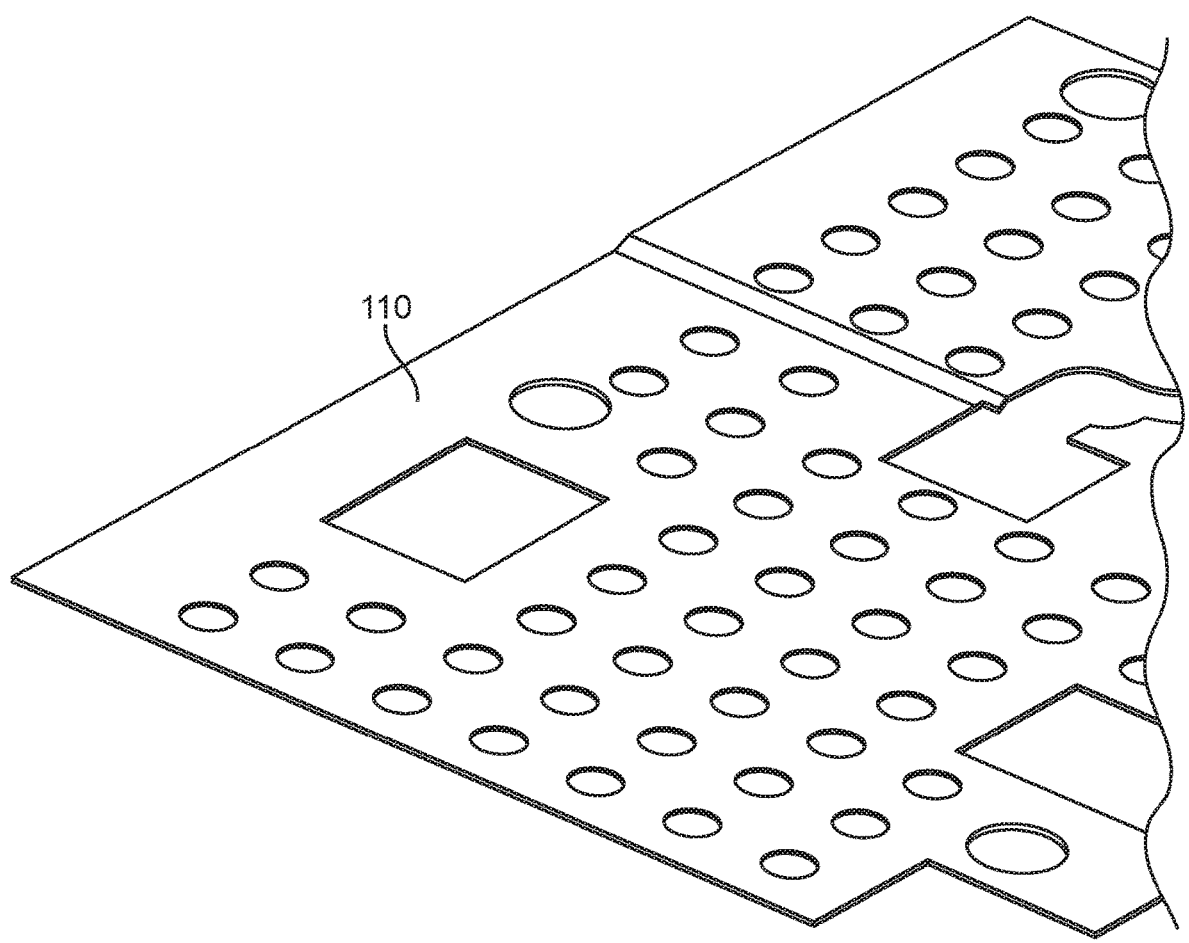
FIG. 1 illustrates an intermediate layer for a system-in-package module according to an embodiment of the present invention.

FIG. 1 illustrates an intermediate layer for a system-in-package module according to an embodiment of the present invention. Intermediate layer 100 may be formed of metal or other conductive material. Intermediate layer 110 may be formed by die cutting, stamping, printing, or other technique. Intermediate layer may be used for shielding, grounding, heat spreading, or other reasons in a system-in-package module. Intermediate layer 110 may include several openings and passages through which encapsulation material may flow during assembly.

Figure 2:
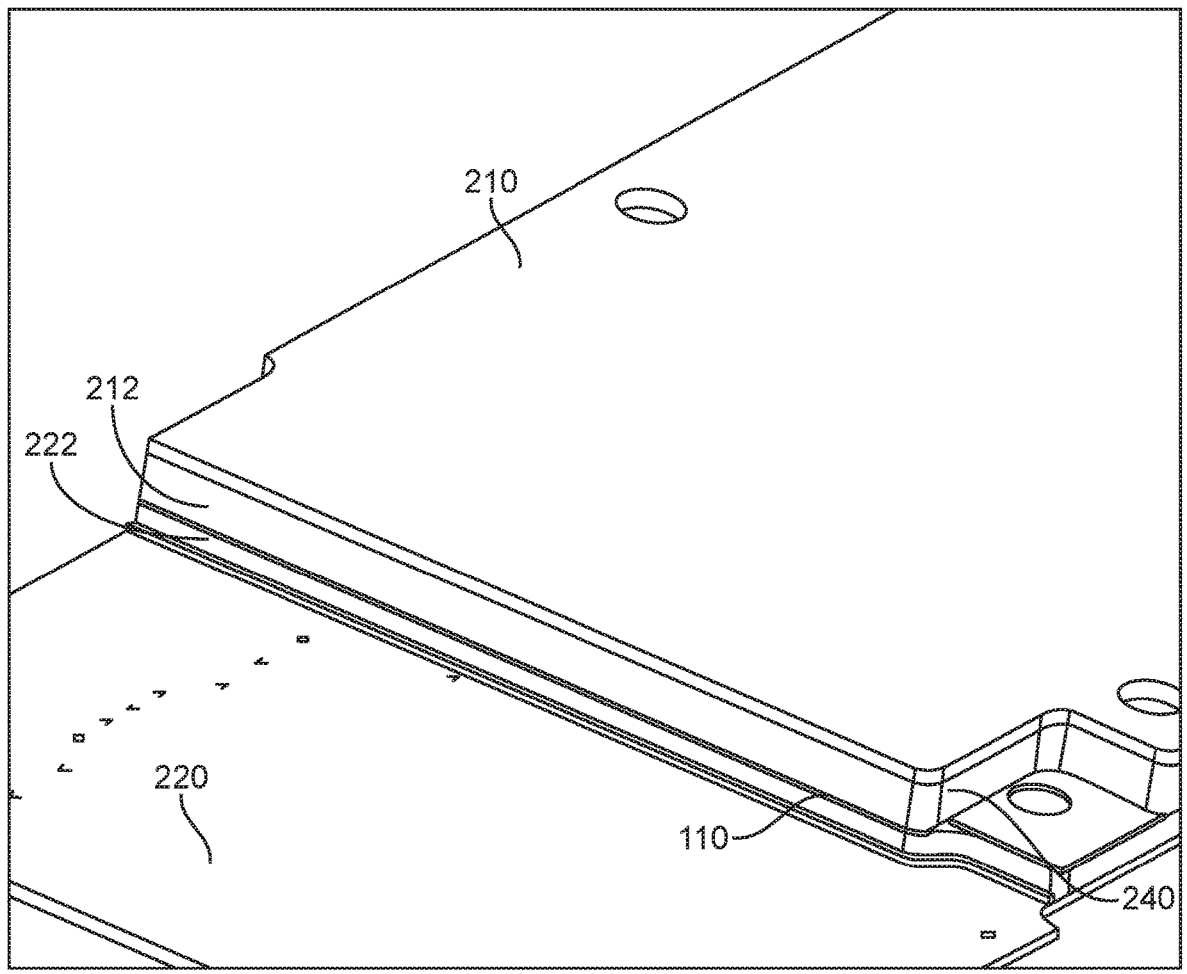
FIG. 2 illustrates a system-in-package module according to an embodiment of the present invention.

FIG. 2 illustrates a system-in-package module according to an embodiment of the present invention. This example may include top printed circuit board 210 and bottom printed circuit board 220. Intermediate layer 110 may be located between top printed circuit board 210 and bottom printed circuit board 220. Layers of encapsulation material 212 and 222 may be formed between intermediate layer 110 and top printed circuit board 210 and intermediate layer 110 and bottom printed circuit board 220. Intermediate layer 110 may have openings (shown in FIG. 1) to allow encapsulation material 212 and 222 to flow though intermediate layer 110 during assembly. After encapsulation, the system-in-package module may be trimmed along the edges 240 of the encapsulation material. This may be done using a laser, computer numerical control (CNC) machine, router, or other appropriate tool.

Edges 240 of the system-in-package module may be printed or plated with silver, gold, or other material. The plating may then be insulated for use in an electronic device. Masking or other techniques may be used in applying the plating and insulating materials. In these and other embodiments of the present invention, these layers may be used as shielding. They may also be used as antennas, particularly where the system-in-package module includes wireless circuitry. Passive components, such as resistors, capacitors, inductors, and other components may be formed using these and other layers along edges 240 and elsewhere in and on the system-in-package module.

In various embodiments of the present invention, various types of encapsulation materials and methods may be used. An example is shown in the following figure.

Figure 3:
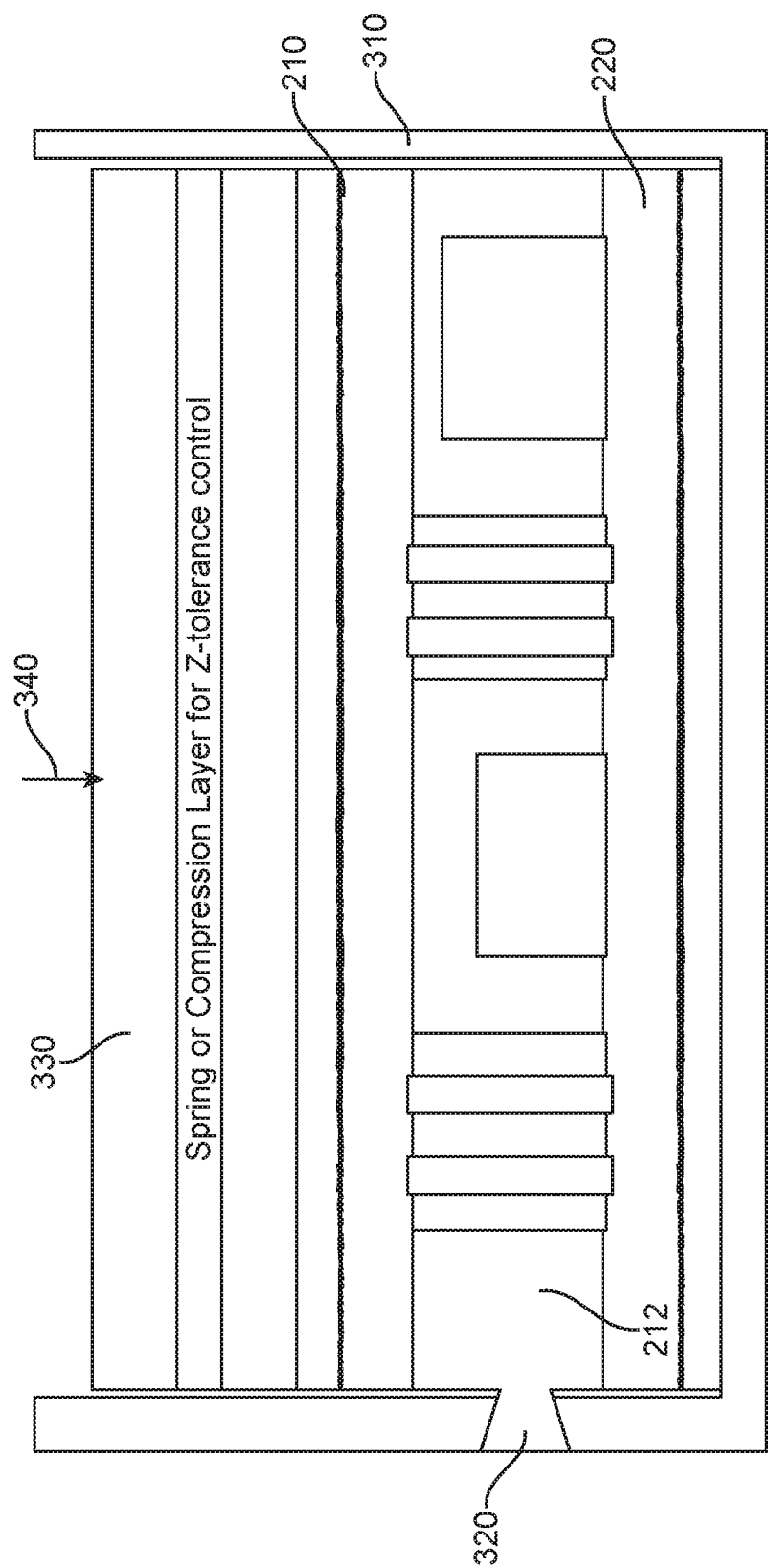
FIG. 3 illustrates a method of encapsulating a system-in-package module according to an embodiment of the present invention.

FIG. 3 illustrates a method of encapsulating a system-in-package module according to an embodiment of the present invention. In this example, a system-in-package module may include top printed circuit board 210 and bottom printed circuit board 220, which may be located in tool 310. Tool 310 may have an exit location 320. Encapsulation material 212 may be placed between top printed circuit board 210 and bottom printed circuit board 220. A force 340 may be applied to a spring or compression layer 330. Spring or compression layer may push top printed circuit board 210 towards bottom printed circuit board 220. Excess encapsulation material 212 may exit tool 310 at exit location 320.

In the above example, edges 240 of the system-in-package module may need to be trimmed, plated, and insulated. Also, communication between top printed circuit board 210 and bottom printed circuit board 220 may be difficult. Accordingly, these and other embodiments of the present invention may provide frames, interposers, or other structures that may be located between top printed circuit board 210 and bottom printed circuit board 220. A frame may be located around edges of one or both of the printed circuit boards. That is, where a top printed circuit board 210 and a bottom printed circuit board 220 may have an overlapping area, the frame may follow and be along some or all of an outline of the overlapping area. The frame may include other portions that are not located around edges of either printed circuit board. For example, the frame may include portions that traverse from one edge of a frame to another edge of a frame along a middle of a printed circuit board, that is, through the overlapping area. These frames may provide mechanical support, shielding, signal pathways, printed circuit board alignment, and other features for the SIP modules. An example of one such frame is shown in the following figure.

Figure 4A:
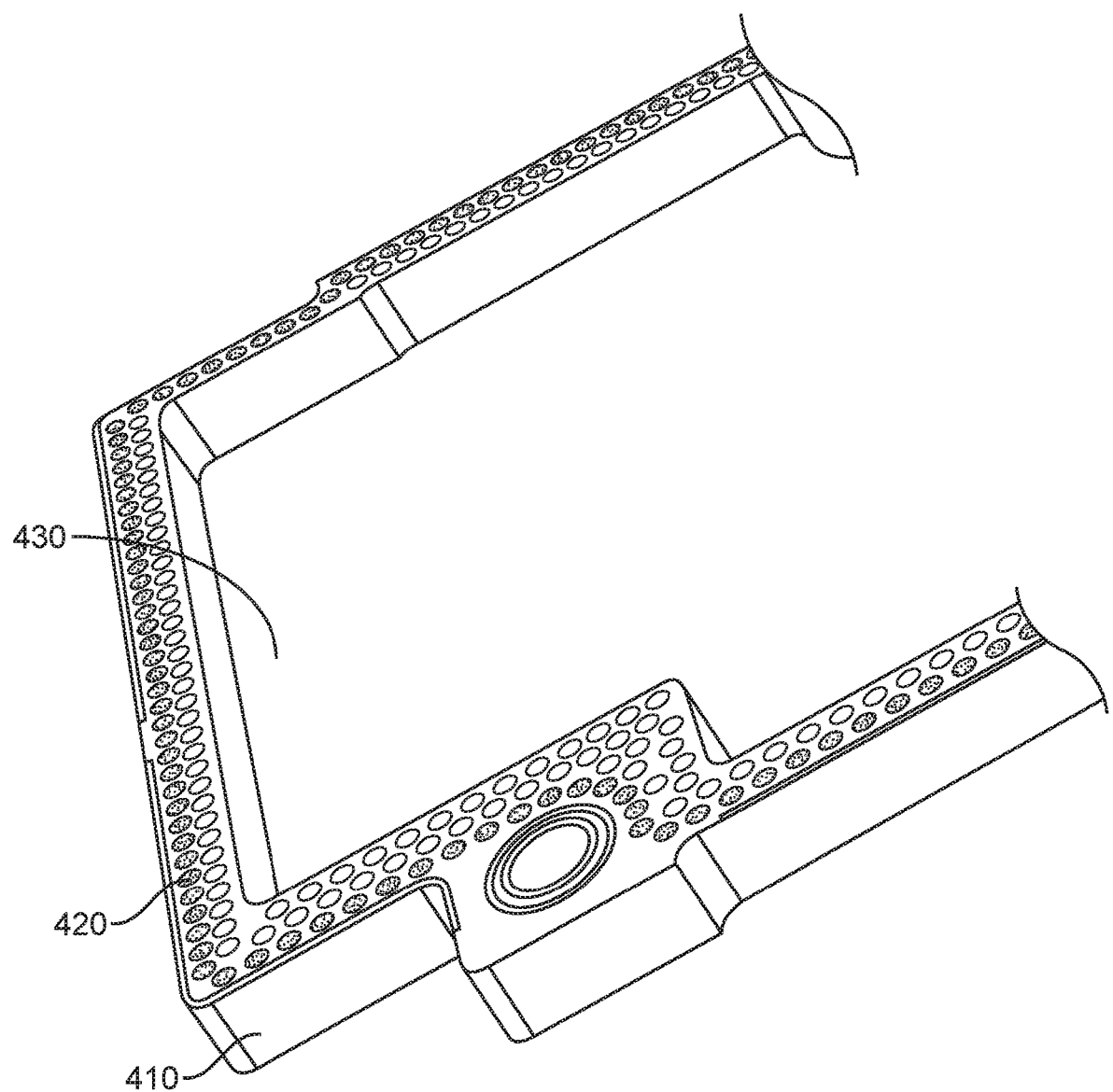
FIG. 4A illustrates a portion of a frame according to an embodiment of the present invention and FIG. 4B illustrates a system-in-package module according to an embodiment of the present invention.

FIG. 4A illustrates a portion of a frame according to an embodiment of the present invention. Frame 410 may be made from a printed circuit board. Frame 410 may be formed using a CNC machine, router or other tool. A number of through holes may be drilled through frame 410 and filled to provide vias 420. Vias 420 may align with and electrically and physically connect to pads, contacts, or vias on top printed circuit board 210 and bottom printed circuit board 220 to facilitate communication between circuitry on those boards.

As with the other frames shown herein or other frames consistent with embodiments of the present invention, frame 410 may be sized to fit along edges of either or both top printed circuit board 210 or bottom printed circuit board 220 (shown in FIG. 2.) That is, frame 410 (and the other frames shown here) may follow an edge of a first board, where the edge of a first board is coincident or overlapping with an edge of the second board. In this way, the frame remains between the boards and at (or near) an outside edge of the SIP module such that space inside the SIP module is maximized and is not wasted. Also or instead, these frames may have intermediate portions that traverse between edges of either or both top printed circuit board 210 or bottom printed circuit board 220. These intermediate portions may be used to isolate various circuits in the SIP modules.

Figure 4B:
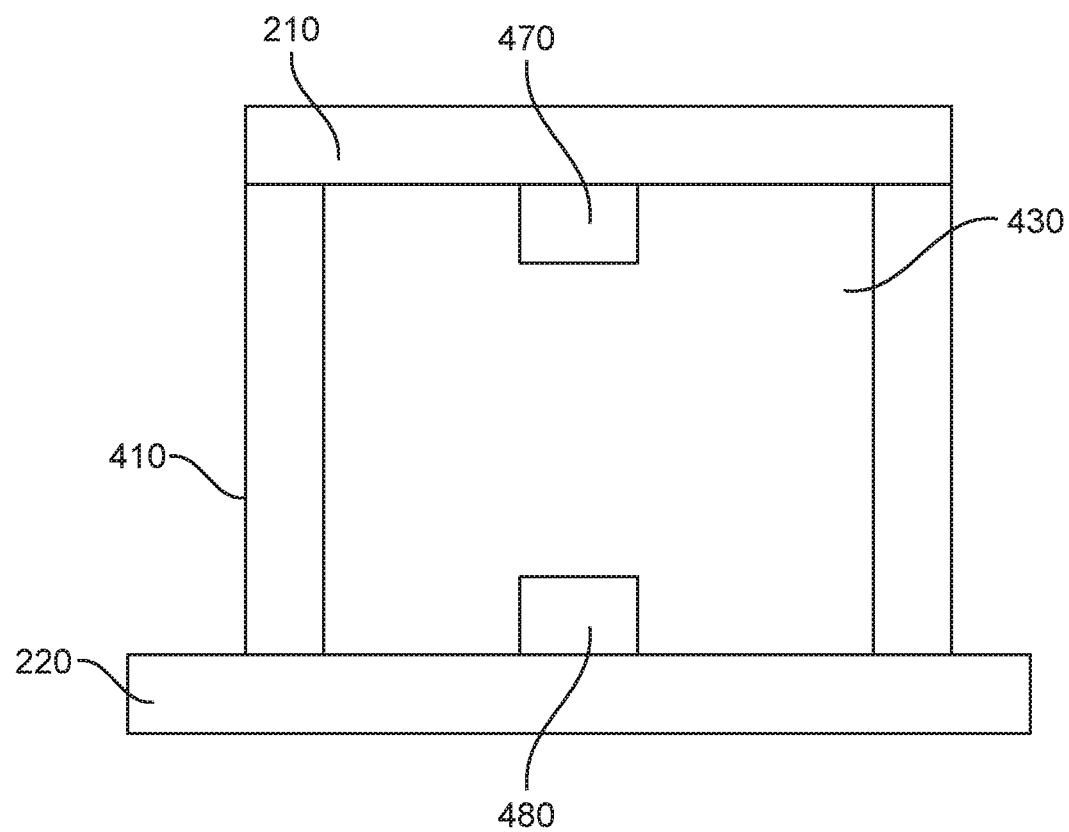

As with the other frames shown herein or other frames consistent with embodiments of the present invention, as shown in FIG. 4B, frame 410 may be located around components on facing surfaces of top printed circuit board 210 and bottom printed circuit board 220 (also shown in FIG. 2.) In this example, a first component 470 on a surface of top printed circuit board 210 may be in region 430 of frame 410. Similarly, a second component 480 on a surface of bottom printed circuit board 220 may be in region 430 of frame 410. The first component may connect through a first trace in top printed circuit board 210 to a first contact on the surface of top printed circuit board 210. The first contact may connect to a via 420 (shown in FIG. 4A) in frame 410 (or other interconnect in other frames.) The via may connect the first contact to a second contact on a surface of the bottom printed circuit board 220. A second trace in the bottom printed circuit board 220 may connect the second contact to the second component. The region 430 may be encapsulated in each of the frames shown herein and that are consistent with embodiments of the present invention.

As with the other frames shown herein or other frames consistent with embodiments of the present invention, only a portion of frame 410 is shown. Frame 410, and the other frames herein, may formed a closed loop, or more than one closed loop, or they may have one or more open ends.

As with the other frames shown herein or other frames consistent with embodiments of the present invention, frame 410 may be formed of a printed circuit board. This printed circuit board may, as with the other printed circuit boards such as top printed circuit board 210 and bottom printed circuit board 220, be formed of various layers with various traces on the layers and vias interconnecting traces on the various layers. These vias and layers may provide for a lateral translation of the signal path through the frame 410.

In these and other embodiments of the present invention, frames may be formed of other materials. For example, frames may be formed using laser direct structuring (an LDS frame), injection molded plastic, or other material. An example is shown in the following figure.

Figure 5:
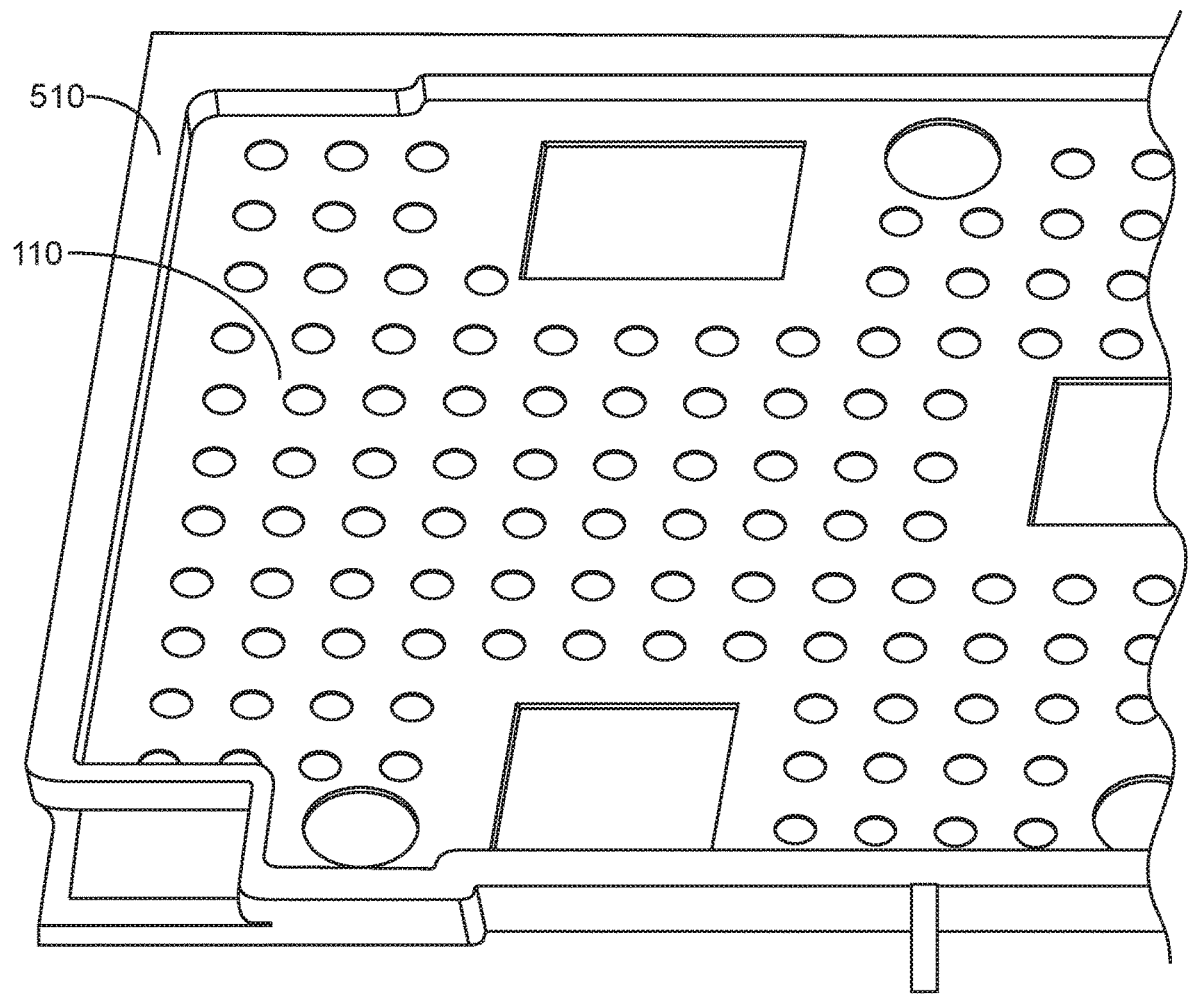
FIG. 5 illustrates a portion of a system-in-package module according to an embodiment of the present invention.

FIG. 5 illustrates a portion of a system-in-package module according to an embodiment of the present invention. In this example, intermediate layer 110 may be framed by frame 510. Frame 510 may be an LDS frame, it may be made of injection molded plastic, or it may be made of another material.

Figure 6:
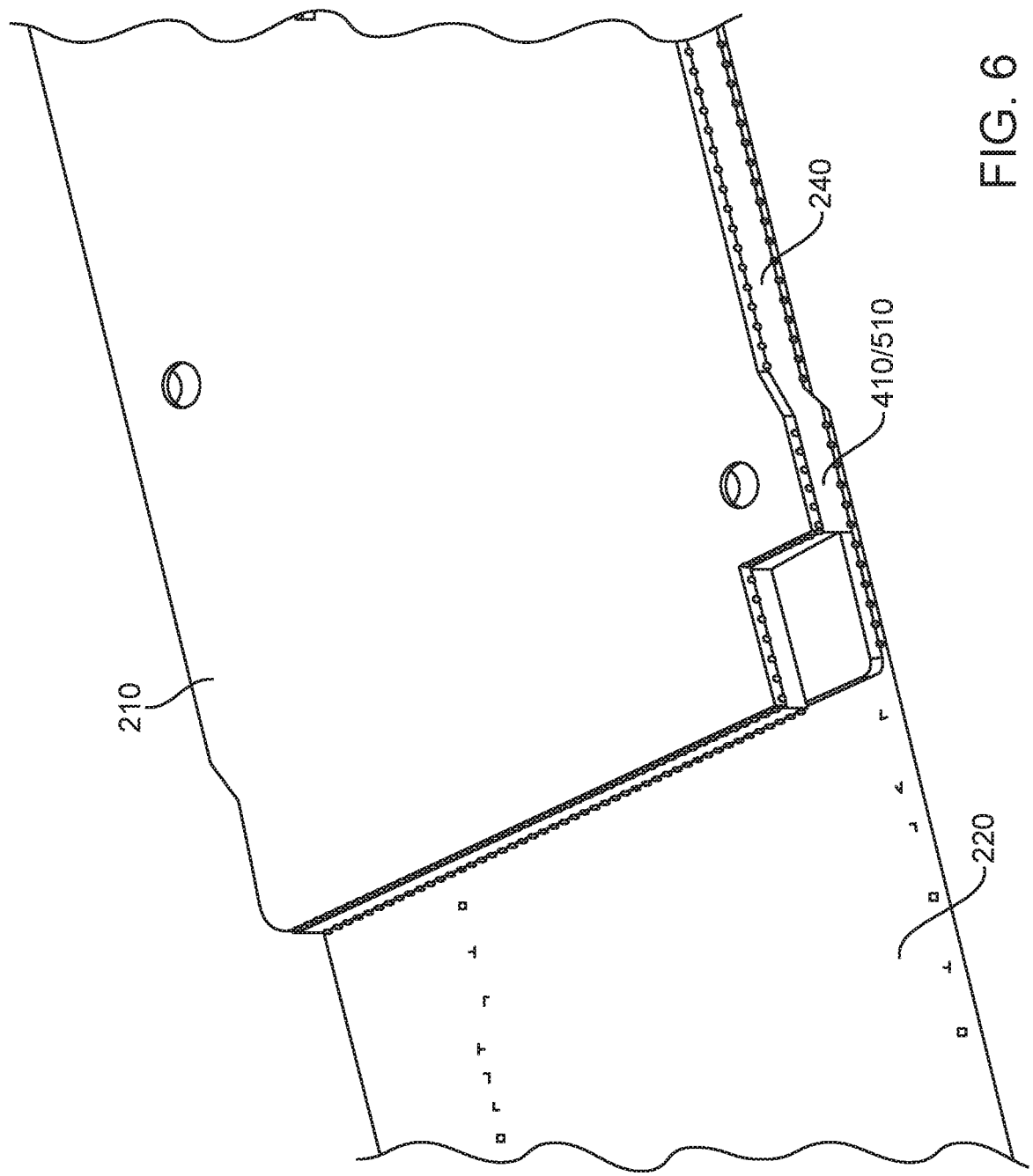
FIG. 6 illustrates a system-in-package module according to an embodiment of the present invention.

FIG. 6 illustrates a system-in-package module according to an embodiment of the present invention. In this example, either of frames 410 or 510 (shown in FIG. 4 and FIG. 5), or any of the other frames described here or that are consistent with embodiments of the present invention, may be located between top printed circuit board 210 and bottom printed circuit board 220. During manufacturing, top printed circuit board 210 and bottom printed circuit board 220 may be soldered to frame 410 or 510. The space between top printed circuit board 210 and bottom printed circuit board 220 may be filled with an encapsulation material. If needed, edges 240 of the system-in-package module may be trimmed, for example with a CNC machine, router, laser, or other tool.

In these and other embodiments of the present invention, other features may be included on a frame. An example is shown in the following figure.

Figure 7:
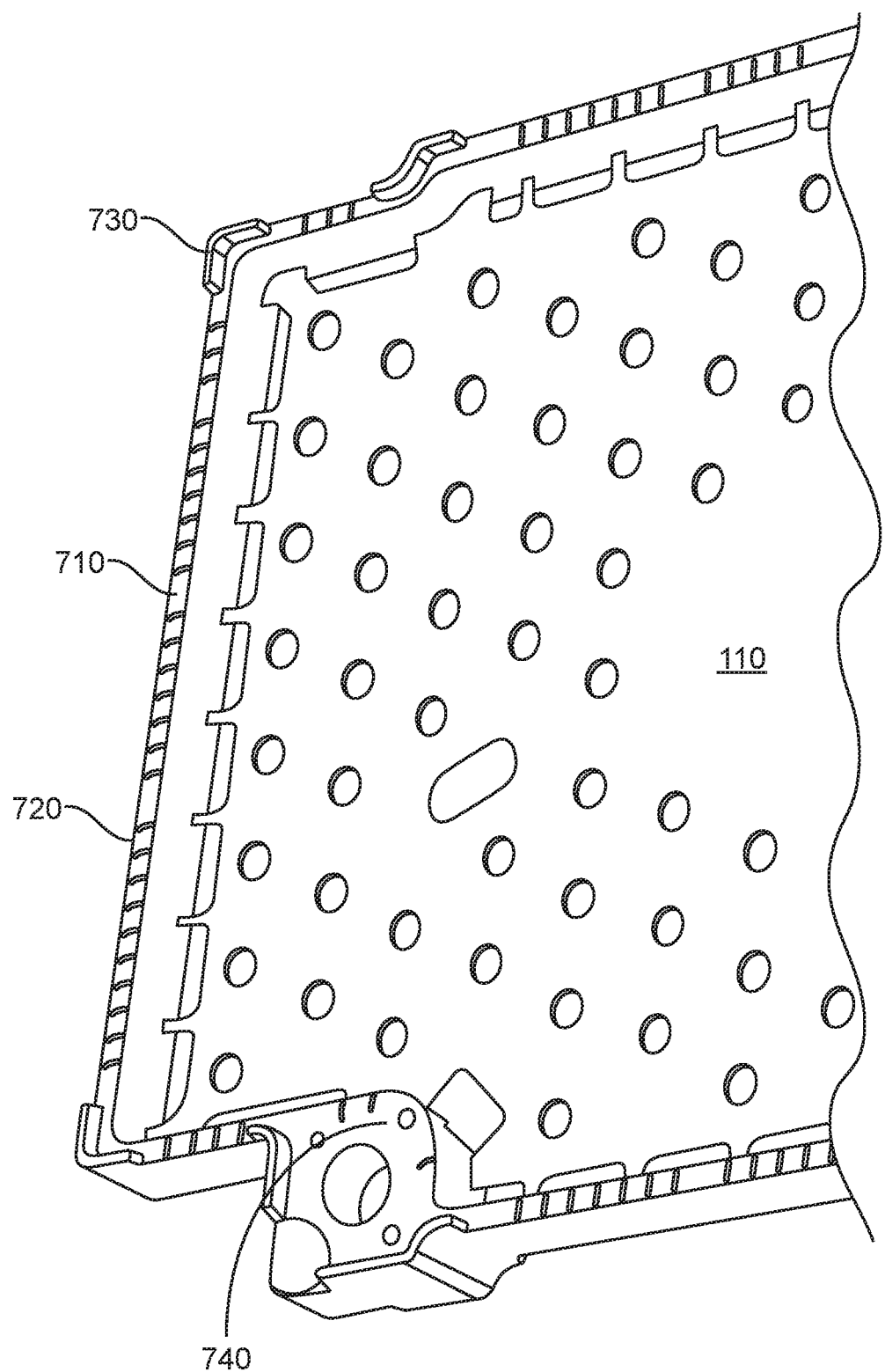
FIG. 7 illustrates a portion of a system-in-package module according to an embodiment of the present invention.

FIG. 7 illustrates a portion of a system-in-package module according to an embodiment of the present invention. In this example, intermediate layer 110 may be framed by frame 710. Frame 710 may be an LDS frame, it may be formed of plastic, printed circuit board, or other material. Frame 710 may include a number of dimples 720 to increase the friction between frame 710 and top printed circuit board 210 and bottom printed circuit board 220 (shown in FIG. 6.) Frame 710 may further include alignment features 730. Alignment features 730 may be placed along an outside edge of frame 710 to improve the alignment of top printed circuit board 210 and bottom printed circuit board 220 to frame 710. Frame 710 may further include hard stops 740 that may be used to accurately set a thickness of the encapsulation material and therefor the thickness of the resulting system-in-package module. For example, frame 710 may be pliable and compressible. Using a hard stop 740 may prevent this compression and maintain a thickness of frame 710 during assembly.

In these and other embodiments of the present invention, still other features may be included on a frame. Examples are shown in the following figure.

Figure 8:
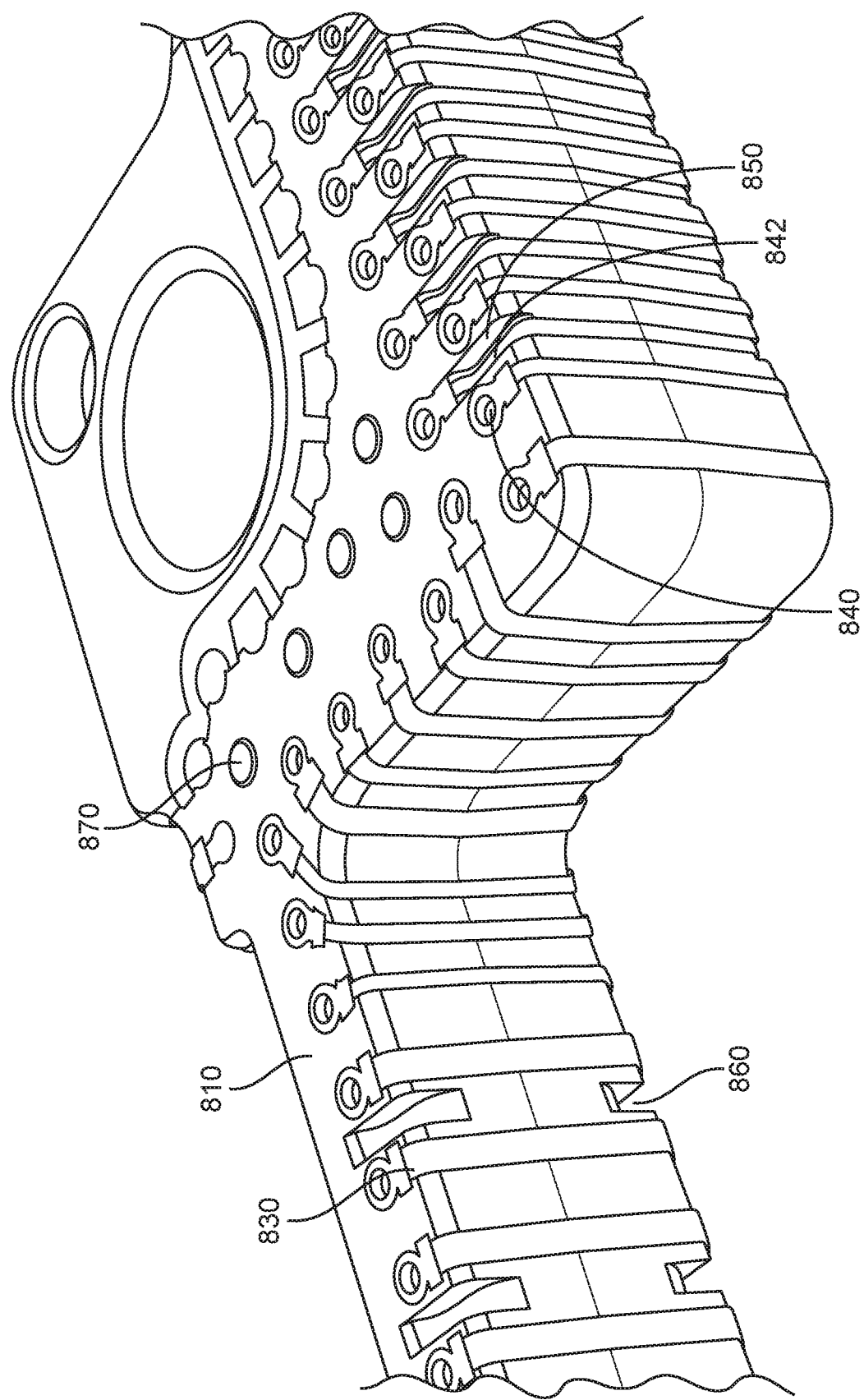
FIG. 8 illustrates a portion of a frame according to an embodiment of the present invention.

FIG. 8 illustrates a portion of a frame according to an embodiment of the present invention. In this example, frame 810 may be an LDS or other type of frame. Interconnect traces 830 may be formed along sides of frame 810 to provide signal, power, and ground routes between top printed circuit board 210 and bottom printed circuit board 220 (shown in FIG. 2.) Mechanical slots 860 may be included along top and bottom inside edges of frame 810. Mechanical slots 860 may help with adhesion between frame 810 and top printed circuit board 210 and bottom printed circuit board 220. Specifically, encapsulation material 212 (shown in FIG. 2) may fill mechanical slots 860. The mechanical slots 860 and encapsulation material in the mechanical slots 860 may form interlocking features that may secure frame 810 in place. Additional escape slots 850 may also be included. These slots may act similar to mechanical slots 860 to improve adhesion. Escape slots 850 may also increase a spacing between solder pads 840 and traces 842, thereby reducing the possibility that they are shorted together by solder during assembly. Pins 870 may be molded or inserted into frame 810. Pins 870 may provide additional signal, power, and ground routes between top printed circuit board 210 and bottom printed circuit board 220. Pins 870 may also provide mechanical strength to frame 810. Pins 870 may also provide a hard stop (similar to hard stops 740 in FIG. 7) that may be used to accurately set a thickness of the encapsulation material and therefor the thickness of the resulting system-in-package module. For example, frame 810 may be pliable and compressible. Using pins 870 as hard stops may prevent this compression and maintain a thickness of frame 810 during assembly.

In these and other embodiments of the present invention, interconnect between components on top printed circuit board 210 and bottom printed circuit board 220 may be included on a LDS frame. Examples are shown in the following figures.

Figure 9:
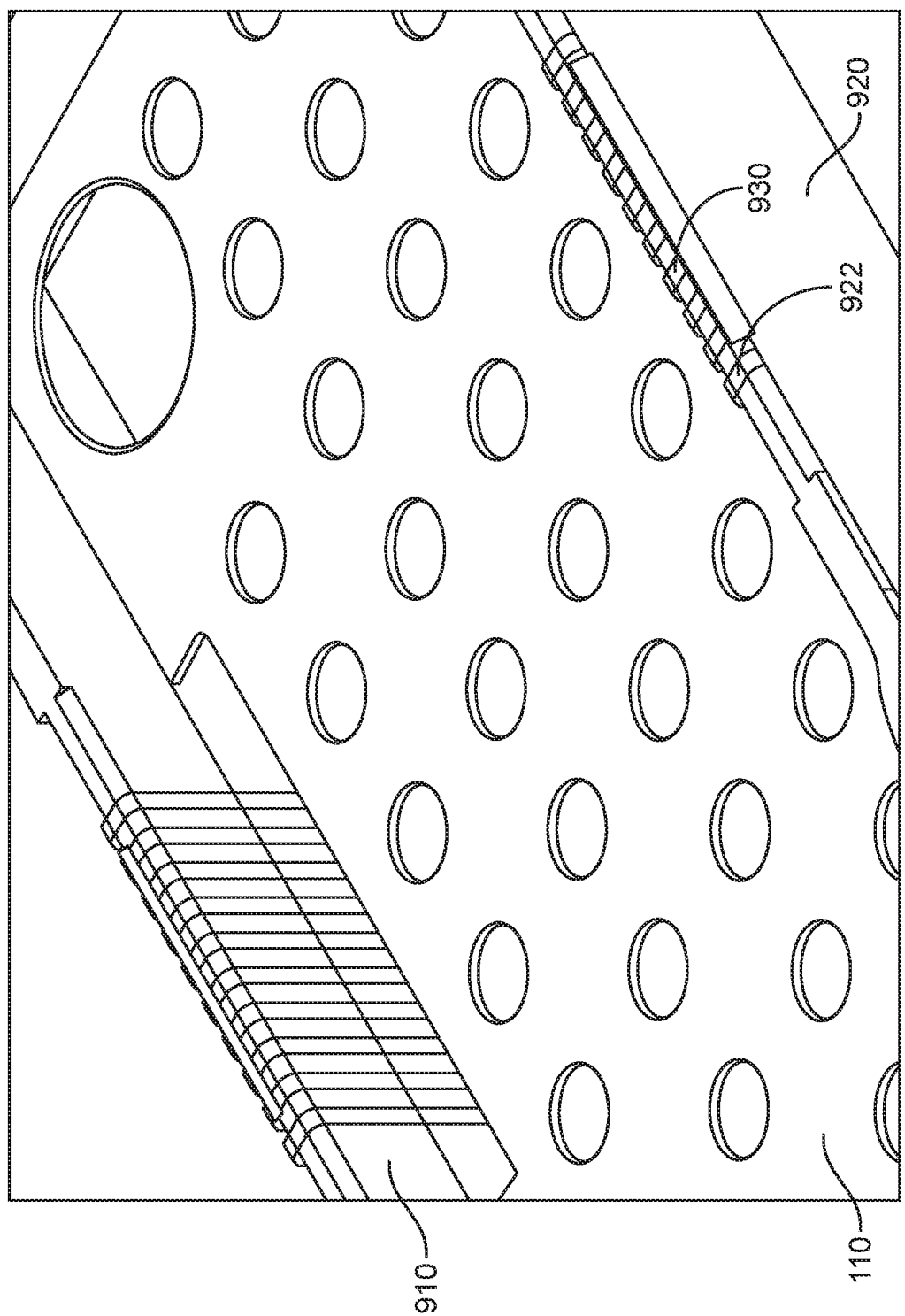
FIG. 9 illustrates a portion of a system-in-package module according to an embodiment of the present invention.

FIG. 9 illustrates a portion of a system-in-package module according to an embodiment of the present invention. In this example frame 910 may be formed around intermediate layer 110. Frame 910 may be an LDS or other frame. An outside edge of frame 910 may be shielded with metallic layer 920. Contacts 922 may connect to shielding layer 920 and provide a ground path between top printed circuit board 210 and bottom printed circuit board 220. Signal paths 930 may also be provided from top printed circuit board 210 to bottom printed circuit board 220.

In these examples, metal interconnect may be formed on LDS frame 910 by a laser abrading the desired conductive pads. The desired conductive paths may then be plated to complete frame 910.

Figure 10:
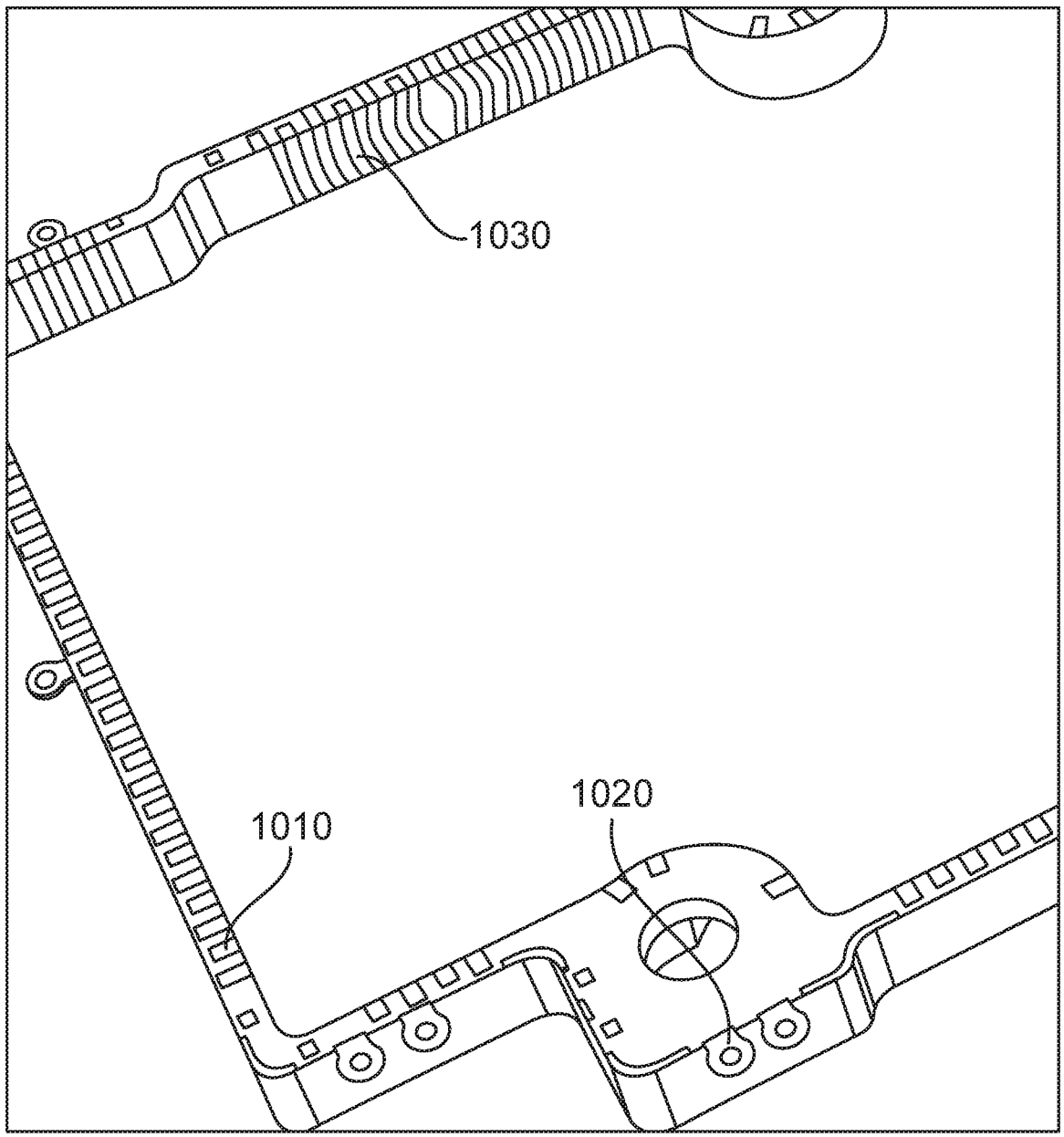
FIG. 10 illustrates another portion of a frame according to an embodiment of the present invention.

FIG. 10 illustrates another portion of a frame according to an embodiment of the present invention. Frame 1010 may include signal paths 1030, which may route from a top of frame 1010 to a bottom of frame 1010. As illustrated, interconnect or signal paths 1030 do not need to be formed using straight lines, but may form any pattern and may also be used to provide a lateral translation in the signal path. Tabs 1020 may connect to ground or shield regions of frame 1010. Tabs 1020 may be soldered to either or both top printed circuit board 210 and bottom printed circuit board 220 during assembly.

Figure 11:
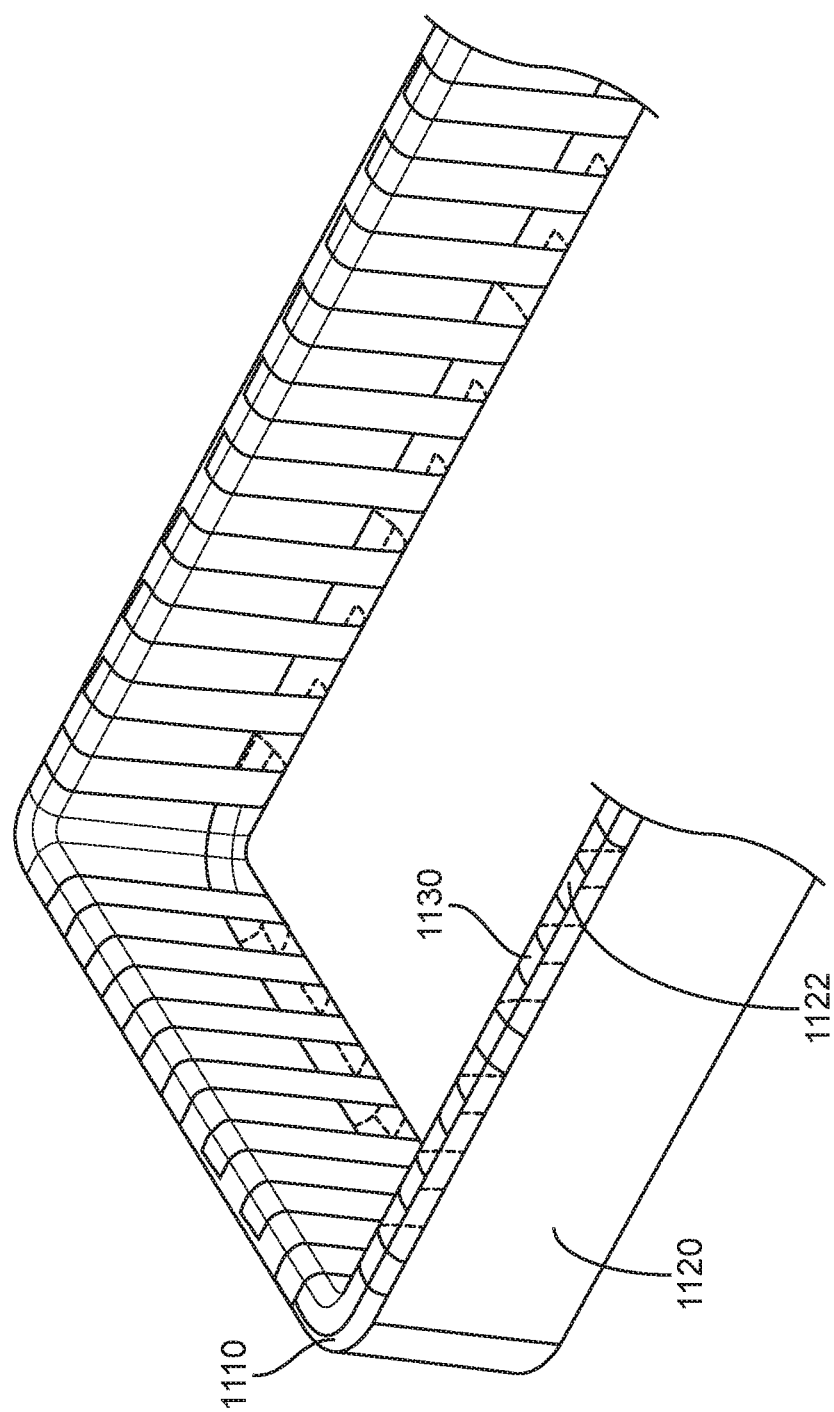
FIG. 11 illustrates another portion of a frame according to an embodiment of the present invention.

FIG. 11 illustrates another portion of a frame according to an embodiment of the present invention. In this example, frame 1110 may include outside shielding 1120. Contacts 1122 may connect to shielding 1120 and may provide ground pathways between top printed circuit board 210 and bottom printed circuit board 220. Signal paths 1130 may also be included from a top of frame 1110 to a bottom of frame 1110.

Figure 12:
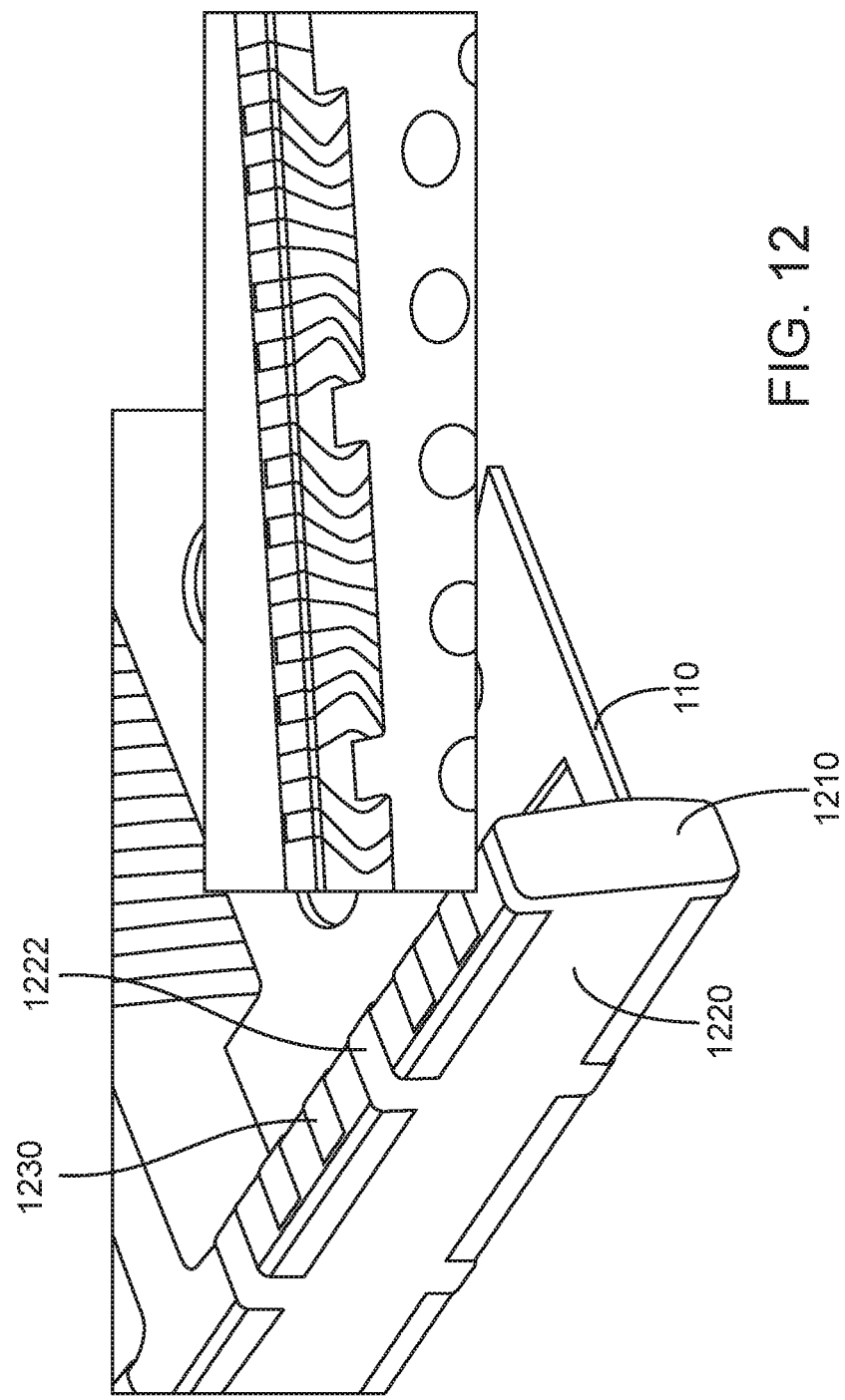
FIG. 12 illustrates a portion of a system-in-package module according to an embodiment of the present invention.

FIG. 12 illustrates a portion of a system-in-package module according to an embodiment of the present invention. In this example, intermediate layer 110 may be surrounded by frame 1210. An outside edge of frame 1210 may be plated with ground shield 1220. Contacts 1222 may provide ground connections between top printed circuit board 210 and bottom printed circuit board 220. Signal pathways 1230 may be used for communications between circuits on top printed circuit board 210 and bottom printed circuit board 220.

Figure 13:
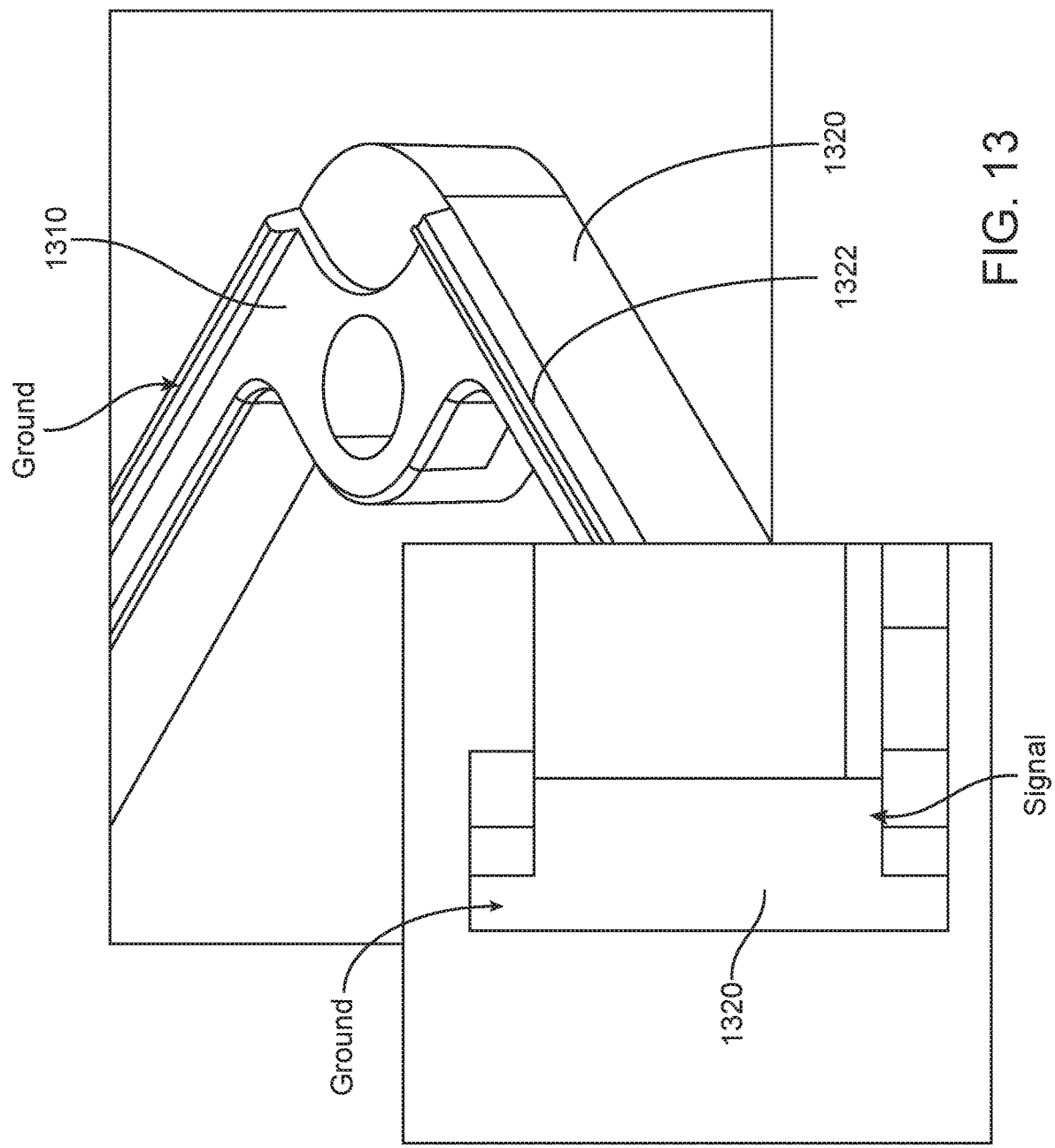
FIG. 13 illustrates a portion of a frame according to an embodiment of the present invention.

FIG. 13 illustrates a portion of a frame according to an embodiment of the present invention. In this example, an outside edge of frame 1310 may be formed of metal 1320. This outside edge of metal 1320 may include lip 1322. Lip 1322 may be used in aligning top printed circuit board 210 and bottom printed circuit board 220 to frame 1310. In this example, the relatively thick metal 1320 may provide mechanical support for frame 1310, as well as shielding, grounding, heat dissipation, and other purposes.

In various embodiments of the present invention, other types of structures may be used for signal pathways. Examples are shown in the following figures.

Figure 14:
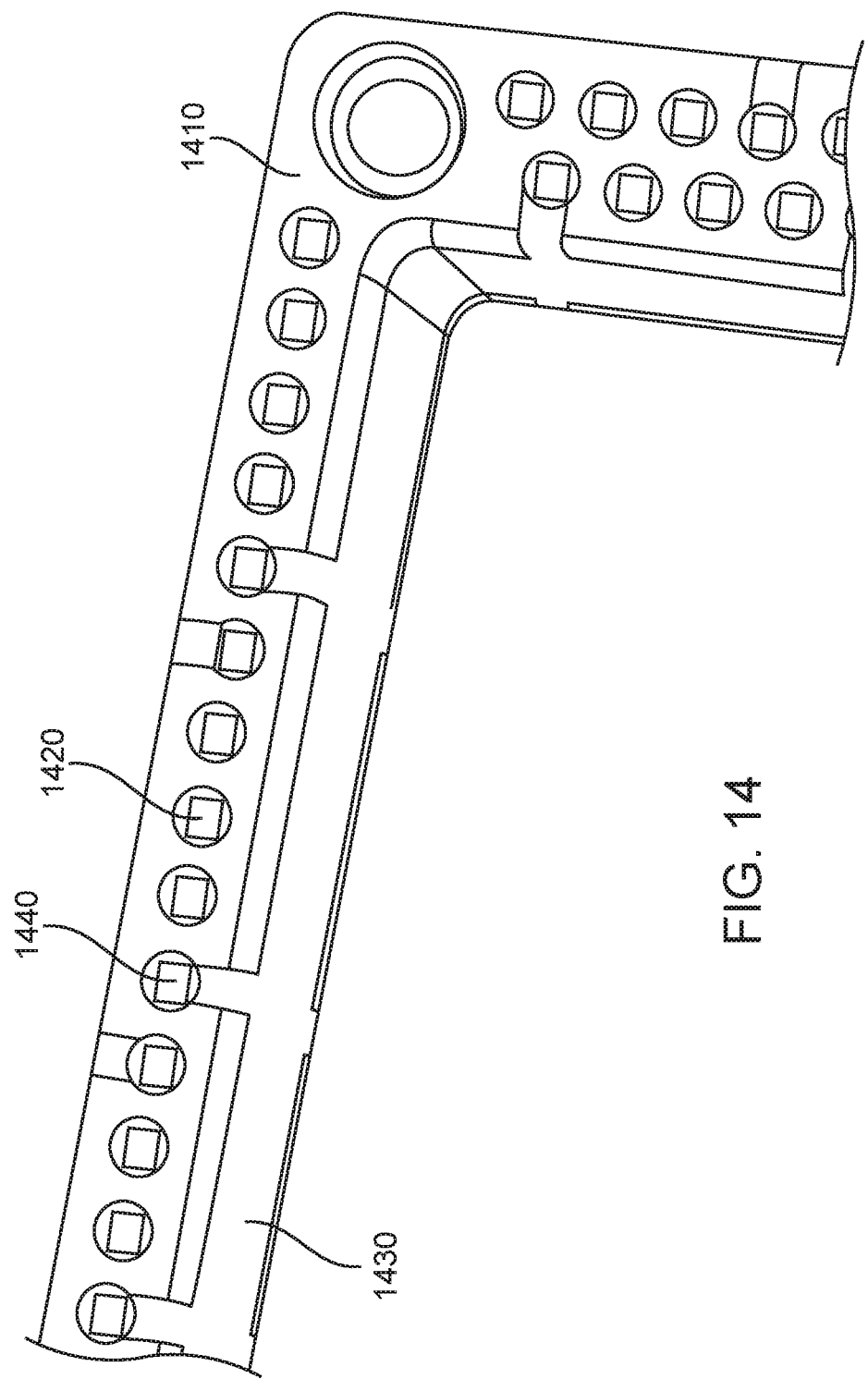
FIG. 14 illustrates a portion of a frame according to an embodiment of the present invention.

FIG. 14 illustrates a portion of a frame according to an embodiment of the present invention. In this example, metallic pins 1420 may be inserted into LDS or plastic frame 1410. Shielding 1430 may connect to one or more of the pins 1420, shown here as pin 1440. Pins 1420 may be used to convey signals between top printed circuit board 210 and bottom printed circuit board 220, while pins 1440 may provide ground paths between the boards. The frame of FIG. 14 may be formed in various ways. An example is shown in the following figure.

Figure 15:
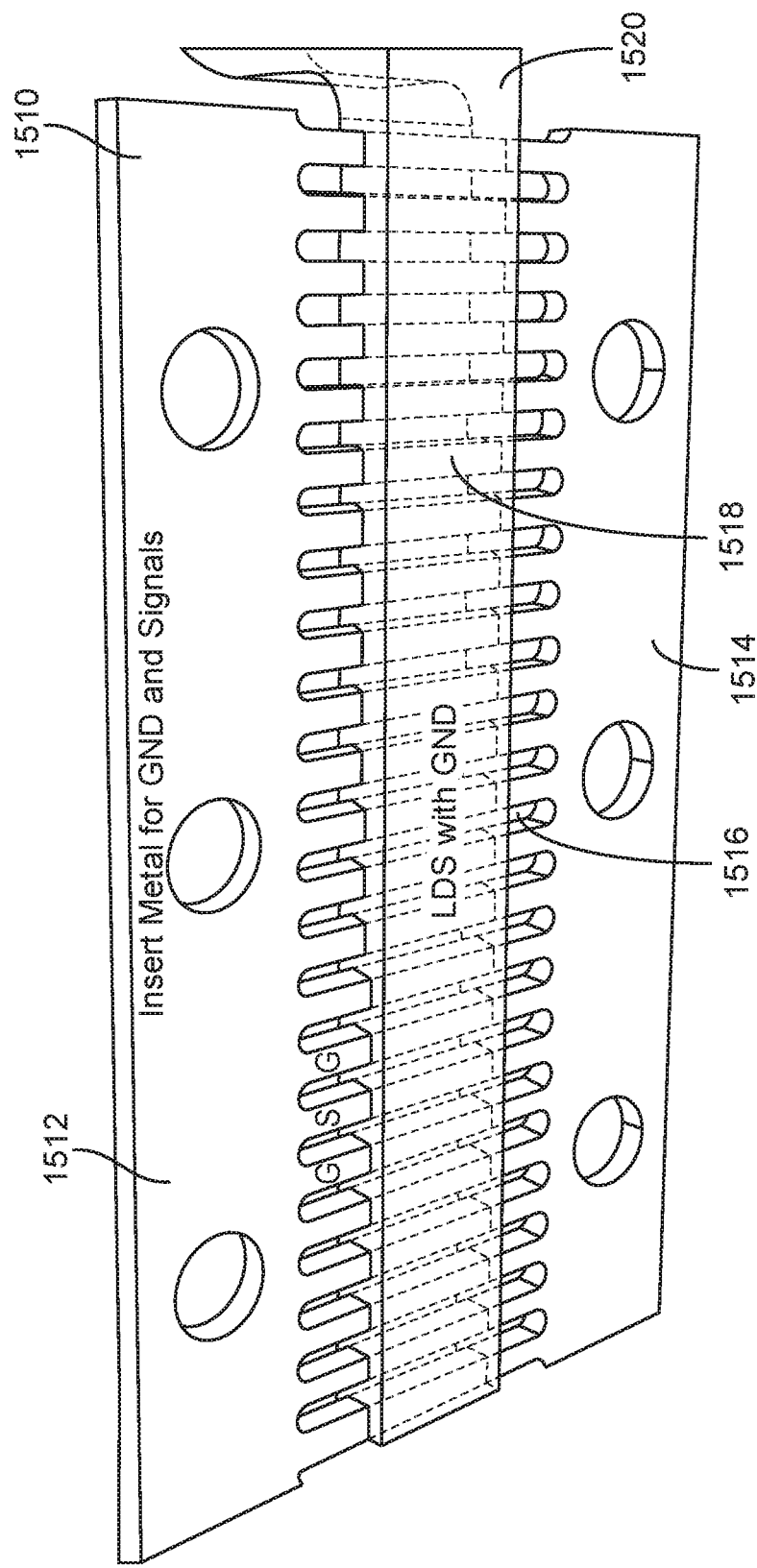
FIG. 15 illustrates a method of manufacturing a portion of a frame according to an embodiment of the present invention.

FIG. 15 illustrates a method of manufacturing a portion of a frame according to an embodiment of the present invention. In this example, metal plate 1510 may include openings 1516 defining pins 1518. LDS or other plastic may be molded around pins 1518 to form frame 1520. A top section 1512 and bottom section 1514 of metal plate 1510 may be removed, thereby leaving behind a plastic or LDS frame 1520 with embedded pins 1518. In these and other embodiments of the present invention, pins 1518 may instead, or also, be inserted into frame 1520 after molding. For example, a tool used to form frame 1520 may leave holes in frame 1520 such that pins 1518 may be mechanically pushed into the holes.

In these and other embodiments of the present invention, it may be desirable to transfer very high-speed or radio-frequency signals from top printed circuit board 210 to bottom printed circuit board 220. Examples of frames that may be used for this are shown in the following figures.

Figure 16:
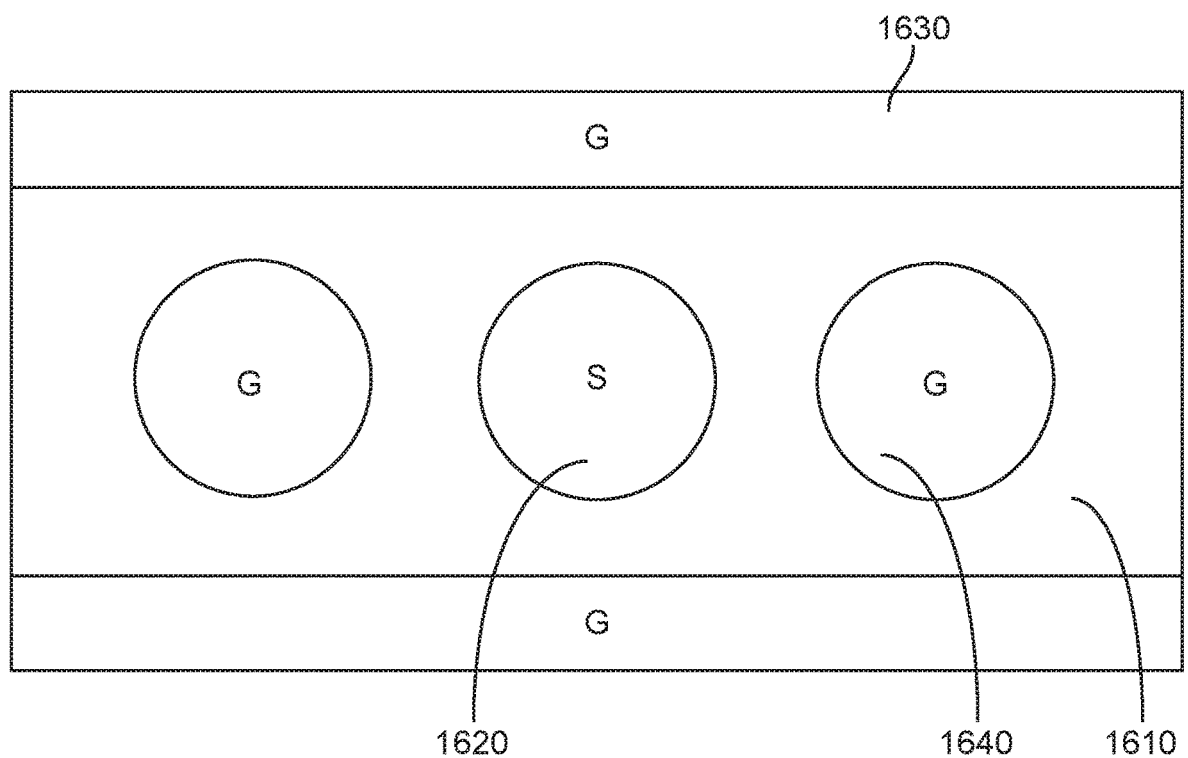
FIG. 16 illustrates a top view of a shielded signal path in a portion of a frame according to an embodiment of the present invention.

FIG. 16 illustrates a top view of a shielded signal path in a portion of a frame according to an embodiment of the present invention. Frame 1610 may include pins 1620 and 1640. Pins 1620 may convey a signal, while pins 1640 may be grounded. Ground shield layers 1630 may also be included on sides of frame 1610. In this way, a signal on signal pin 1620 may be shielded.

In these and other embodiments of the present invention, it may be desirable to improve a strength of these contacts. An example of how this may be done is shown in the following figure.

Figure 17:
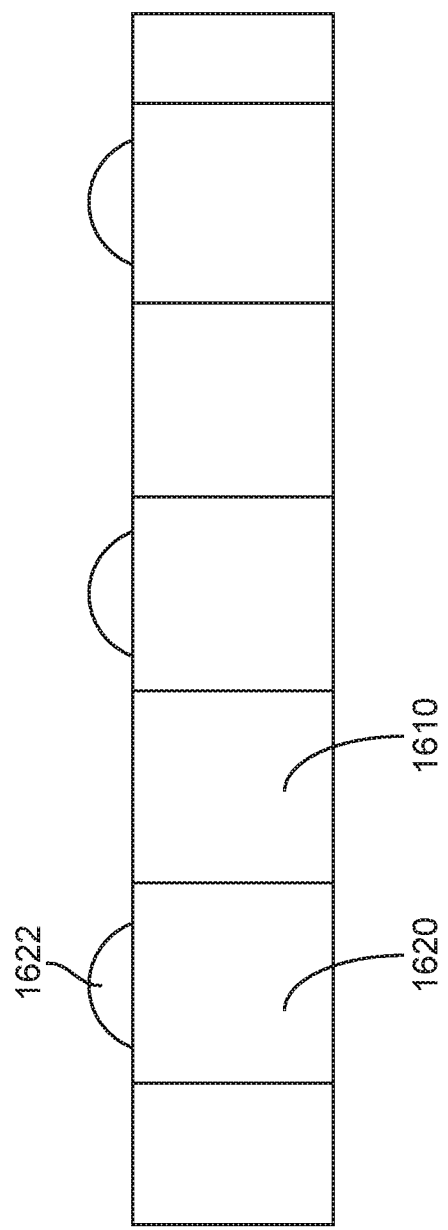
FIG. 17 illustrates a side cross-section view of a portion of the frame of FIG. 16.

FIG. 17 illustrates a side cross-section view of a portion of the frame of FIG. 16. In this example, frame 1610 may include signal pin 1620 as before in FIG. 16. A domed structure 1622 may be formed, deposited, or otherwise located on a top surface of pin 1620. This domed structure 1622 may improve a strength of pin 1620.

Figure 18:
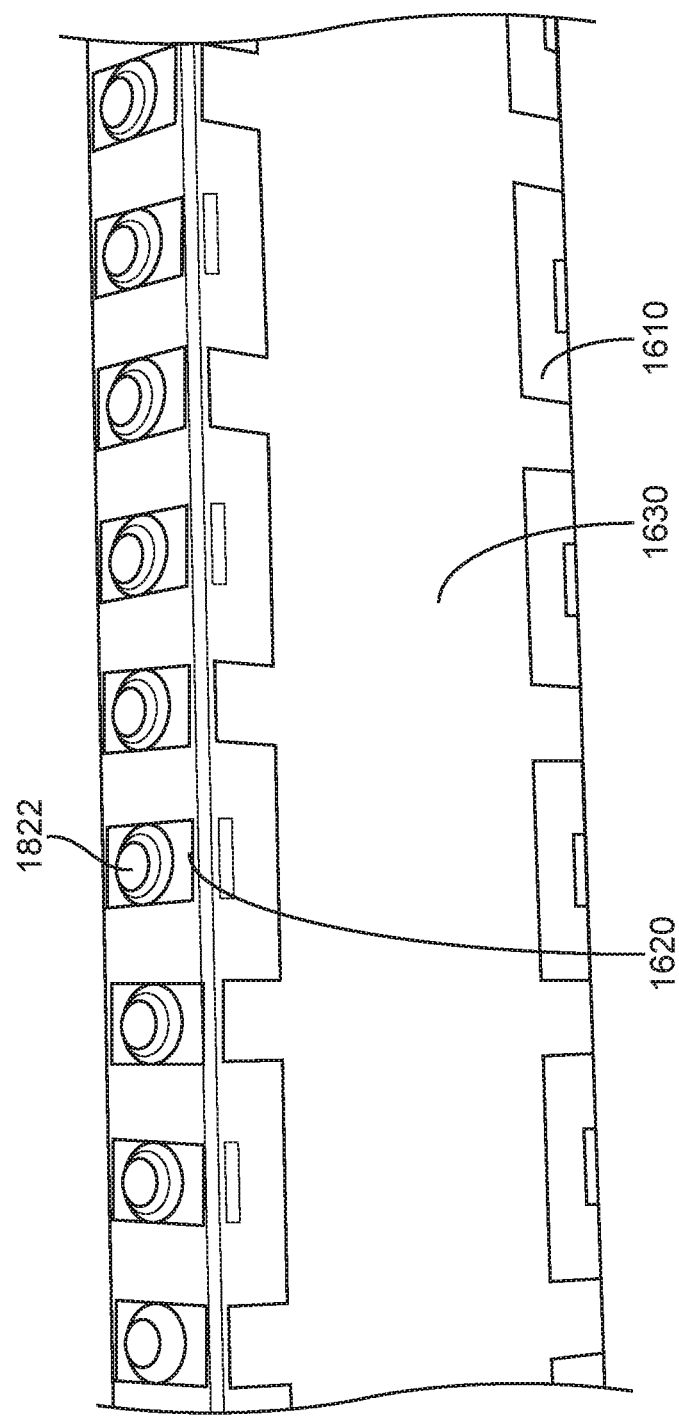
FIG. 18 illustrates a side view of a portion of the frame of FIG. 16.

FIG. 18 illustrates a side view of a portion of the frame of FIG. 16. In this example, frame 1610 may include signal pin 1620 as before in FIG. 16. A domed structure 1822 may be formed as part of frame 1610. That is, domed structure 1822 may be molded along with the other portions of frame 1610. This domed structure 1822 may improve a strength of pin 1620. The dome structure 1822 may help to reduce an amount of solder that would otherwise be displaced when frame 1610 is soldered to top printed circuit board 210 and bottom printed circuit board 220. The domed structures 1822 may also reduce stress on frame 1610. An interconnect trace may be formed on top of the bump when the domed structure 1822 and frame 1610 are formed of LDS. Side ground plating may be used to form ground shield layers 1630.

In these and other embodiments of the present invention, other structures capable of supporting very high-speed signals through a frame or as a standalone or other structure, may be provided. An example is shown in the following figure.

FIGS. 19A-19I and 20A-20B illustrate methods of manufacturing a high-speed path according to an embodiment of the present invention. These high-speed paths may be located in a frame, they may be standalone structures, or they may be used in other ways.

Figure 19G:
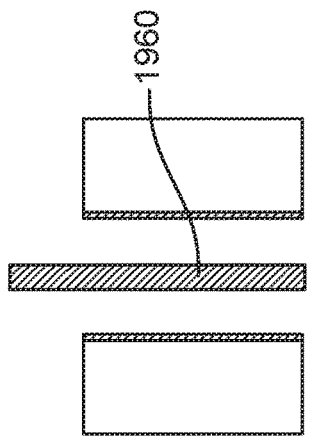
Figure 19H:
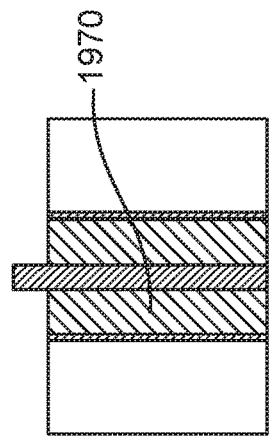
Figure 19I:
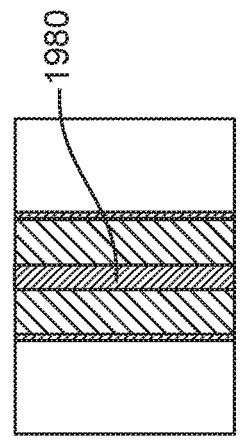
Figure 19D:
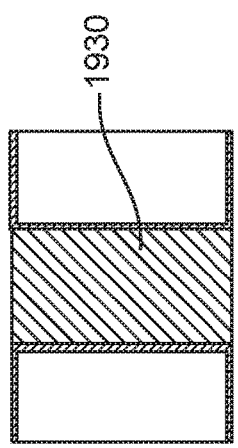
Figure 19E:
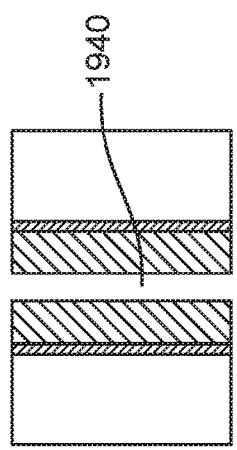
Figure 19F:
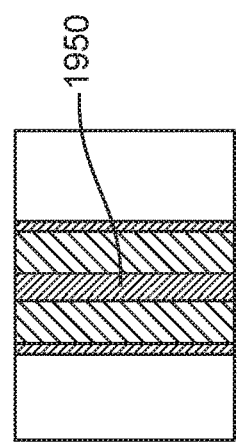
Figure 19A:
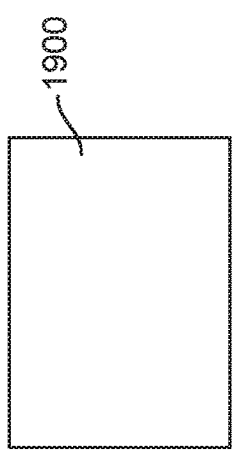
Figure 19B:
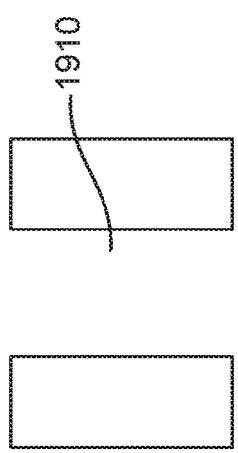

In FIG. 19A, an LDS block 1900 is provided. In FIG. 19B, passage or opening 1910 may be drilled using a laser. This may activate the inside surface for forming a layer of plating 1920 in FIG. 19C.

From this point, at least three different methods may be used. For example, in FIG. 19D, LDS or hot melt molding 1930 may be used to fill opening 1910. In FIG. 19E, second laser drilling may form opening 1940 which again may activate inside surface. Plating 1950 may then fill opening 1940 to complete the structure as shown in FIG. 19F.

In this example, plating 1915 may convey a signal. Plating 1950 may be surrounded by plating 1920, which may be circular or have another shape. Plating 1920 may be grounded to provide a shield for plating 1950.

Figure 19C:
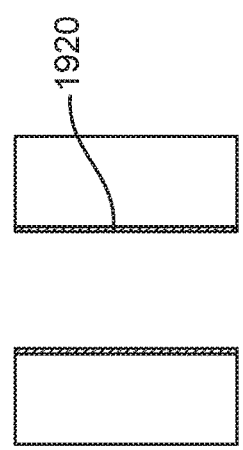

Alternatively, after FIG. 19C, a conductive core 1960 may be inserted in opening 1910, in FIG. 19G. In FIG. 19H, molding 1970 may fill the gap between conductive core 1960 and plating 1920. Conductive core 1960 may be trimmed to form signal pathways 1980 to complete the structure shown in FIG. 19I.

In this example, signal pathway 1980 may convey a signal. Signal pathway 1980 may be surrounded by plating 1920, which may be circular or have another shape. Plating 1920 may be grounded to shield signal pathway 1980.

In FIG. 20A, a section of a coaxial cable may be formed. This section may include central conductor 2010, dielectric or insulation 2020, shield 2030, and outside insulation layer 2040. Outside insulation layer may be removed. The remaining cable portion may be inserted in the frame portion of FIG. 19C, such that shield 2030 contacts plating 1920 on an inside of passage or opening 1910.

In FIG. 20B, central conductor 2010 may convey a signal. Central conductor 2010 may be surrounded by shield 2030 and plating 1920, which may be circular or have another shape. Plating 1920 and shield 2030 may be connected to ground in order to shield central conductor 2010. This coaxial connector may be housed in LDS block 1900, which may be located in a frame, in a standalone structure, or which may be used in other ways.

The techniques of FIGS. 19 and 20, and similar techniques, may be used to form other structures. An example is shown in the following figure.

FIGS. 21A-21D illustrate a method of forming interconnect according to an embodiment of the present invention. This interconnect may be used as a portion of a frame, as a standalone structure, or in other ways. In FIG. 21A, an LDS block 2100 may be provided. In FIG. 21B, portions of a top surface a bottom surface of the block may be activated and plated, resulting in plating 2110. A second LDS mold 2120 may be formed on a top and bottom of block 2100, in FIG. 21C. This second LDS mold may be a lower temperature material to prevent destruction of block 2100 during the formation of mold 2120. In FIG. 21D, a trench 2130 may be formed through the second LDS mold 20. This portion of the surface may be plated with plating 2140 to provide a contact from plating 2140 to lower plating 2110.

In several of the above embodiments, the frames may provide several features. These features may include providing mechanical stability between two facing printed circuit boards of a SIP module. A frame may also provide a boundary for a potting or molding material during assembly. These features may include providing paths for power and signals. The frames may further include shielding for the SIP modules, for example along an outside edge of the SIP module.

In these and other embodiments of the present invention, one or more of these features may be performed by one or more different structures. For example, a frame that does not include paths for power and signals may be used. This frame may be relatively thin as compared to a frame that does include these paths. This frame may be used for mechanical stability between two facing printed circuit boards, and a may provide a boundary for potting or molding material during assembly. This frame may also provide shielding along an outside of a SIP module. To make up for the loss of power and signal paths, connectors may be used between two facing boards. A frame and connector may be formed as a unit, or the frame and connector may be formed separately. The combined space required by this thin frame and connectors may be smaller than a frame that includes both. These connectors may also allow a SIP module to be reworked during assembly.

In these and other embodiments of the present invention, these frames may be formed of metal, such as copper, copper nickel, copper titanium, aluminum, steel, or other copper alloy or other material. These frames may be stamped, middle injection molded, 3-D printed, or formed in other ways. These frames may be formed of plastic and plated or otherwise coated with a conductive material. A frame may extend as a single piece from a top board to a bottom board. In these and other embodiments of the present invention, a frame may be formed of two sections, where a first section is attached to a top board and a second section is attached to a bottom board. These two sections may include interlocking features and may be attached during assembly of the SIP module. An example of such a frame shown in the following figure.

Figure 22:
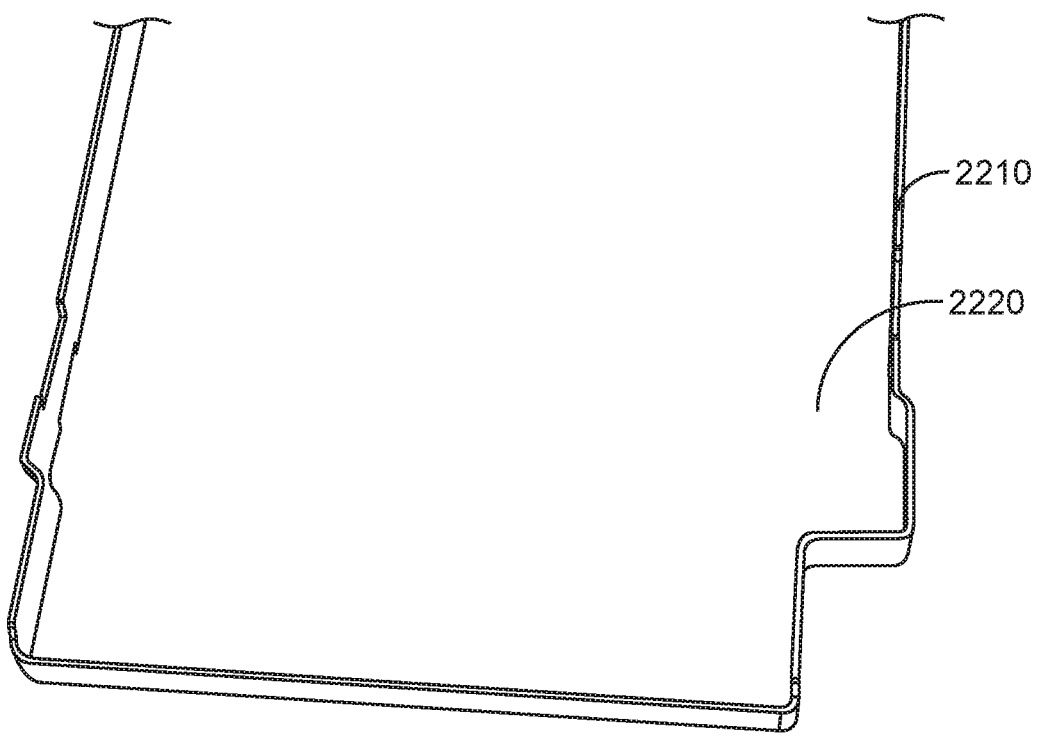
FIG. 22 illustrates a portion of a metallic frame according to an embodiment of the present invention.

FIG. 22 illustrates a portion of a metallic frame according to an embodiment of the present invention. In this example, frame 2210 may be a thin metallic frame. Frames 2210 may be formed of metal, such as copper, copper nickel, copper titanium, aluminum, steel, or other copper alloy or other material. This frame 2210 may be stamped, middle injection molded, 3-D printed, or formed in other ways. Frame 2210 may be located along an edge of a SIP module. Frame 2210 may be located around components (not shown) which may be placed in region 2220. Frame 2210 may provide mechanical support for a top board and a bottom board (not shown.) Frame 2210 may provide a boundary for potting or molding material that may be inserted or otherwise placed in region 2220 during assembly, for example using the method of FIG. 3. Frame 2210 may also provide shielding for a SIP module. Frame 2210 may provide a ground path from a top board (not shown) to a bottom board (not shown) of the SIP module. In these and other embodiments of the present invention, frame 2210 may be formed as a single piece that is connected to both a top board and a bottom board. In these and other embodiments of the present invention, frame 2210 may be formed in two portions that fit or snap together during assembly. One of these portions may be attached to a top board, while another portion may be attached to a bottom board.

For example, as shown in FIG. 2, a frame, for example frame 2210 or another frame shown herein or otherwise consistent with an embodiment of the present invention, may join bottom printed circuit board 220 (shown in FIG. 2) with top printed circuit board 210 (shown in FIG. 2.)

As with the other frames shown herein or other frames consistent with embodiments of the present invention, frame 2210 may be located around components (not shown) located in region 2220 on facing surfaces of top printed circuit board 210 and bottom printed circuit board 220. In this example, a first component (not shown) on a surface of top printed circuit board 210 may be in region 2220 of frame 2210. Similarly, a second component (not shown) on a surface of bottom printed circuit board 220 may be in region 2220 of frame 2210. The first component may connect through a first trace in top printed circuit board 210 to a first contact pad on the surface of top printed circuit board 210. The first contact pad may connect to a second contact pad on a surface of the bottom printed circuit board 220 via a connector, such as one of the connectors shown below. A second trace in the bottom printed circuit board 220 may connect the second contact pad to the second component. The region 2220 may be encapsulated in each of the frames shown herein and that are consistent with embodiments of the present invention.

These contact pads, sometimes referred to as contacts above, may be printed regions on a top surface of a printed surface board. The term contact pad may be used to differentiate from the term contact used in connectors in the embodiments described below.

As with the other frames shown herein or other frames consistent with embodiments of the present invention, only a portion of frame 2210 is shown. Frame 2210, and the other frames herein, may formed a closed loop, or more than one closed loop, or they may have one or more open ends.

Frame 2210 may convey a ground or other power supply between the top board in a bottom board. The size of frame 2210 may be greatly reduced by not having it convey other power supplies or signals. Accordingly, embodiments of the present invention may further include one or more connectors that may be used in conjunction with frame 2210. These connectors may be formed as part of frame 2210. Frame 2210 may be formed as part of these connectors. These connectors may extend along and inside the length of frame 2210, or they may be separate from frame 2210. Examples are shown in the following figures.

Figures 23A, 23B, 23C:
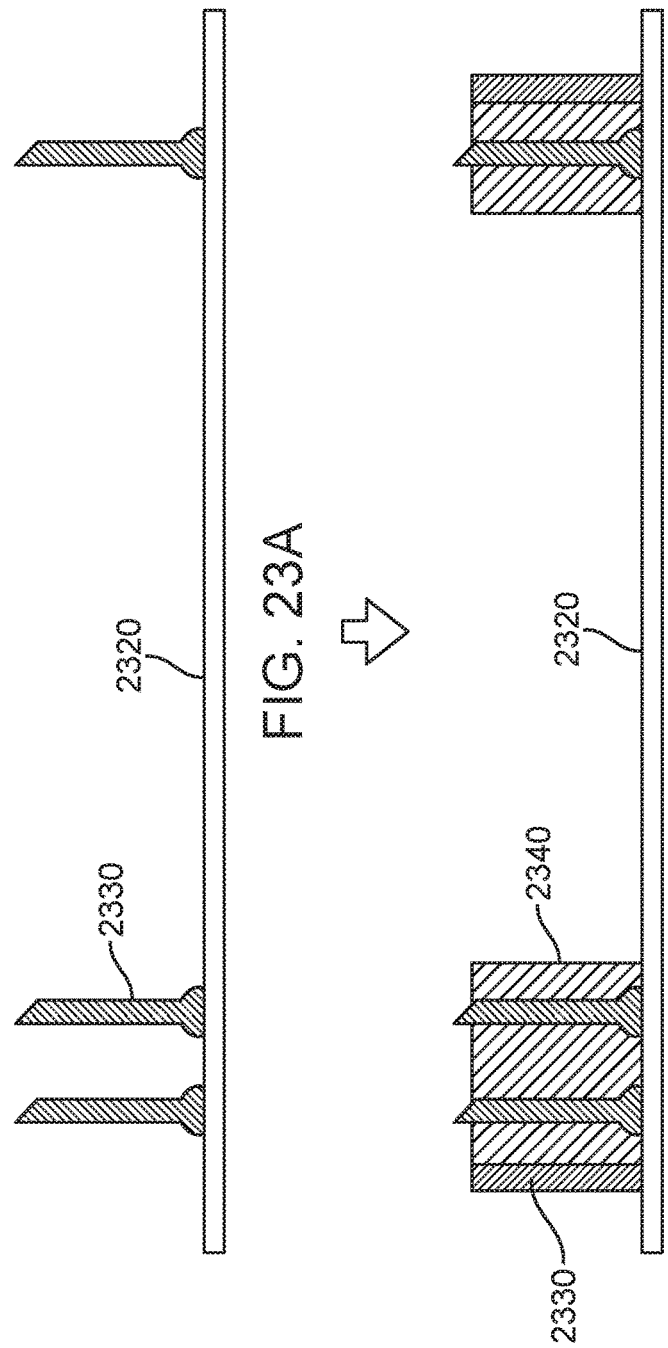
FIGS. 23A-23C illustrate a method of manufacturing a frame and connector according to an embodiment of the present invention.

FIGS. 23A-23C illustrate a method of manufacturing a frame and connector according to an embodiment of the present invention. In this example, a number of compliant wires 2330 may be attached to a board or metal sheet 2320. For example, wires 2330 may be soldered or otherwise attached to a board or metal sheet 2320, as shown in FIG. 23A. An insert molding 2340 may be formed around wires 2330, as shown in FIG. 23B. Frame 2310 may be formed around an outside surface of insert molding 2340. Frame 2310 may be formed by stamping, metal-injection molding, machining, micro-machining, ink-jet, 3-D, plating, aerosol-jet, or other type of printing, or other manufacturing process. In FIG. 23C, board or metal sheet 2320 may be removed. This additive process may save space and may be readily modified to fit different shapes and sizes of SIP modules. A SIP module may then be formed where base portion 2332 of wire 2330 may physically and electrically connect to a first contact pad (not shown) on a bottom printed circuit board (not shown.) A tip 2334 may electrically connect to a second contact pad (not shown) on a top printed circuit board (not shown) to form an electrical path between one or more components of the top printed circuit board and one or more components on the bottom printed circuit board. The connection between tip 2334 and the second contact pad may be physical or it may be through a contact of a connector 2510 (shown in FIG. 25.) A top 2313 and a bottom 2315 of frame 2310 may physically and electrically connect to contact pads on the top printed circuit board and the bottom printed circuit board to form a ground or other path between the boards.

In this example, frame 2310 may be formed. Frame 2310, as with the other frames described below, may have the same or similar attributes as frame 2210 above.

Wires 2330 may be compliant wires that may form electrical connections between two boards (not shown.) In these and other embodiments of the present invention, other types of wires coming different shapes may be used. An example is shown in the following figure.

FIGS. 24A-24C illustrate a method of manufacturing a frame and connector according to an embodiment of the present invention. In FIG. 24A, a number of wires 2430 may be attached to board 2420. In FIG. 24B, an insert molding 2440 may be formed around wires 2430. Board 2420 may be singulated, trimmed, or removed and frame 2410 may be formed along an outside edge of insert molding 2440 in FIG. 24C. Frame 2410 may be formed by stamping, metal-injection molding, machining, micro-machining, ink-jet, 3-D, plating, aerosol-jet, or other type of printing, or other manufacturing process. A SIP module may then be formed where base portion 2432 of wire 2430 may physically and electrically connect to a first contact pad (not shown) on a bottom printed circuit board (not shown.) A tip 2434 may electrically connect to a second contact pad (not shown) on a top printed circuit board (not shown) to form an electrical path between one or more components of the top printed circuit board and one or more components on the bottom printed circuit board. The connection between tip 2434 and the second contact pad may be physical or it may be through a contact of a connector (not shown.) A top 2413 and a bottom 2415 of frame 2410 may physically and electrically connect to contact pads on the top printed circuit board and the bottom printed circuit board to form a ground or other path between the boards.

These contacts, such as those formed by wires 2330 and 2430, may terminate in a second board in various ways. A connector that may be used is shown in the following figure.

Figure 25:
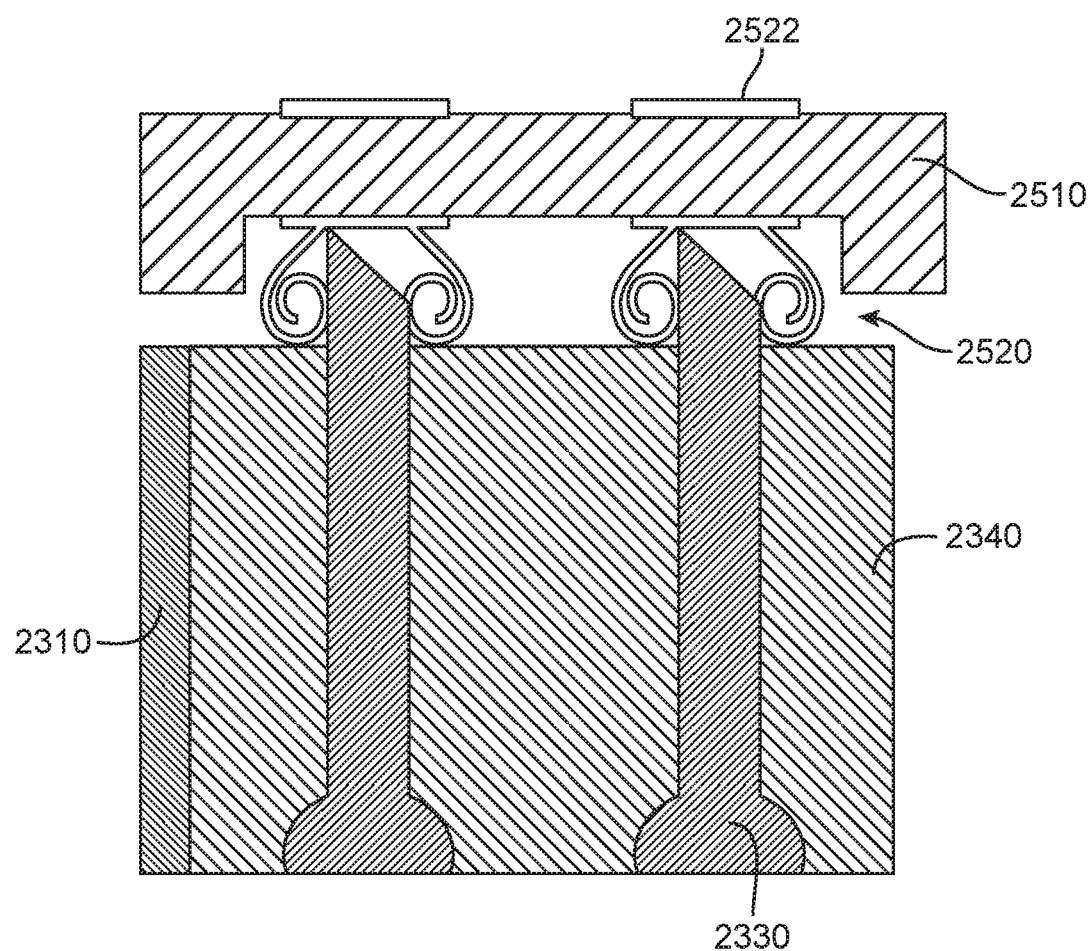
FIG. 25 illustrates a connector for a frame according to an embodiment of the present invention.

FIG. 25 illustrates a connector for a frame according to an embodiment of the present invention. As before, wires 2330 may be encased in insert mold 2340 and shielded by frame 2310. Connector 2510 having contacts 2520 may mate with wires 2330. Again, a top printed circuit board (not shown) may be attached to wires 2330, and a bottom printed circuit board (not shown) may be attached to contacts 2520 at contacting portions 2522.

Figure 26:
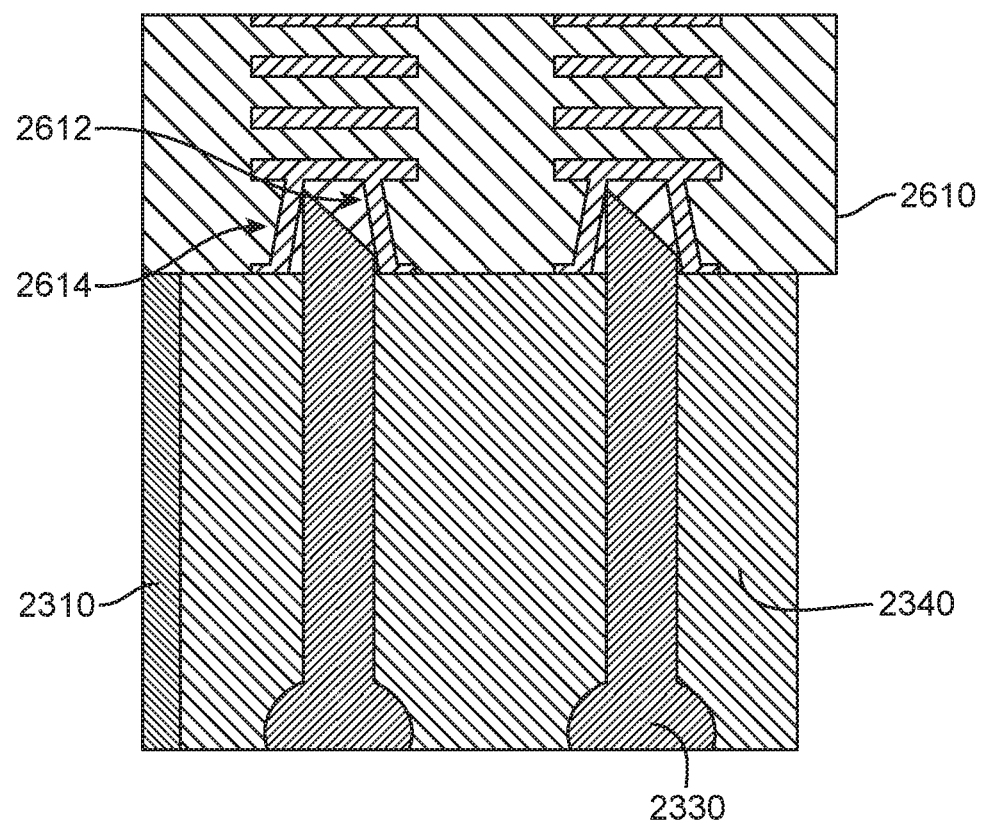
FIG. 26 illustrates a structure for contacting wires in a connector according to an embodiment of the present invention.

FIG. 26 illustrates a structure for contacting wires in a connector according to an embodiment of the present invention. Again in this example, frame 2310 may be formed on the side of insert molding 2340, which may house wires 2330. Board 2610 may include via holes 2614 that are plated with layers 2612. A connection between layer 2612 and wire 2330 may be formed by soldering or other method.

Figure 27A:
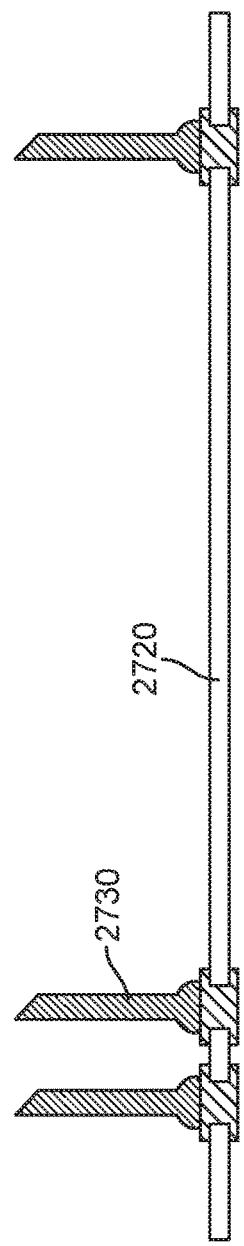
FIG. 27A-27C illustrate a method of manufacturing a frame and connector according to an embodiment of the present invention.
Figure 27B:
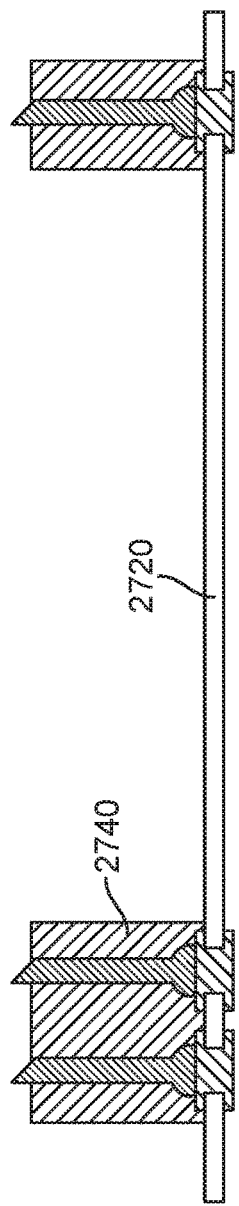
Figure 27C:
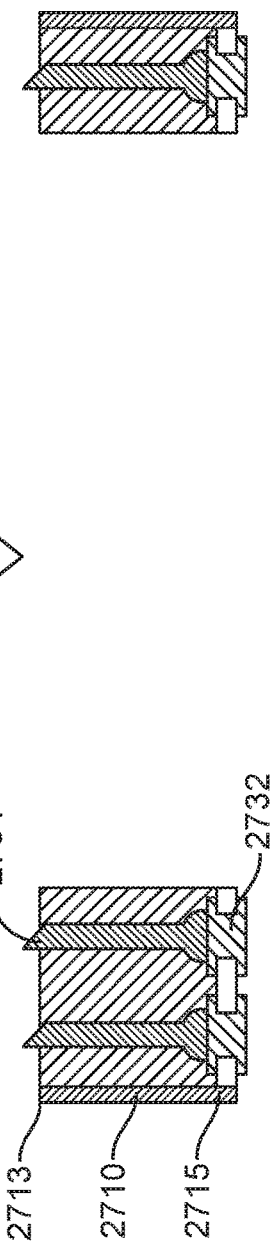

FIG. 27A-27C illustrate a method of manufacturing a frame and connector according to an embodiment of the present invention. In FIG. 27A, a number of compliant wires 2730 may be attached to board 2720. Insert molding 2740 may be formed around wires 2730 in FIG. 27B. Frame 2710 may be formed on the outside surface of insert molding 2740 and board 2720 may be singulated, trimmed, or removed in FIG. 27C. Frame 2710 may be formed by stamping, metal-injection molding, machining, micro-machining, ink-jet, 3-D, plating, aerosol-jet, or other type of printing, or other manufacturing process. A SIP module may then be formed where base portion 2732 of wire 2730 may physically and electrically connect to a first contact pad (not shown) on a bottom printed circuit board (not shown.) A tip 2734 may electrically connect to a second contact pad (not shown) on a top printed circuit board (not shown) to form an electrical path between one or more components of the top printed circuit board and one or more components on the bottom printed circuit board. The connection between tip 2734 and the second contact pad may be physical or it may be through a contact of a connector (for example, connector 2510 in FIG. 25.) A top 2713 and a bottom 2715 of frame 2710 may physically and electrically connect to contact pads on the top printed circuit board and the bottom printed circuit board to form a ground or other path between the boards.

In these and other embodiments of the present invention, various connectors may be used as part of, or along with, a frame. These connectors may be used in conjunction with signal and power connectors that may form interconnect paths from a top board to a bottom board in a SIP module. Examples are shown in the following figures.

FIGS. 28A-28C illustrate a connector system according to an embodiment of the present invention. In FIG. 28A, top board 2820 may be attached to connector 2822. Connector 2822 may include contact 2824. Connector 2850 may also be attached to top board 2820. Housings or other portions of connector 2850 and connector 2822 may be separately or integrally formed. Connector 2850 may include contact 2852. In FIG. 28B, bottom board 2830 may support frame 2810 as well as connector 2860, which may support contact 2862. During assembly, frame 2810 may be inserted into connector 2822, where it may physically and electrically connect to contact 2824. Contact 2824 may be one contact, it may be one long contact along the entire or most of the length of frame 2810, it may be several contacts broken up along a length of frame 2810, or may have another configuration. Contact 2862 on connector 2860 may mate with contacts 2852 of connector 2850 to form electrical connections for signals or power between devices (not shown) on top board 2820 and devices (not shown) on bottom board 2830.

Again, frames, like frames 2210 and 2810, may be formed in sections and then joined. An example is shown in the following figure.

Figure 29:
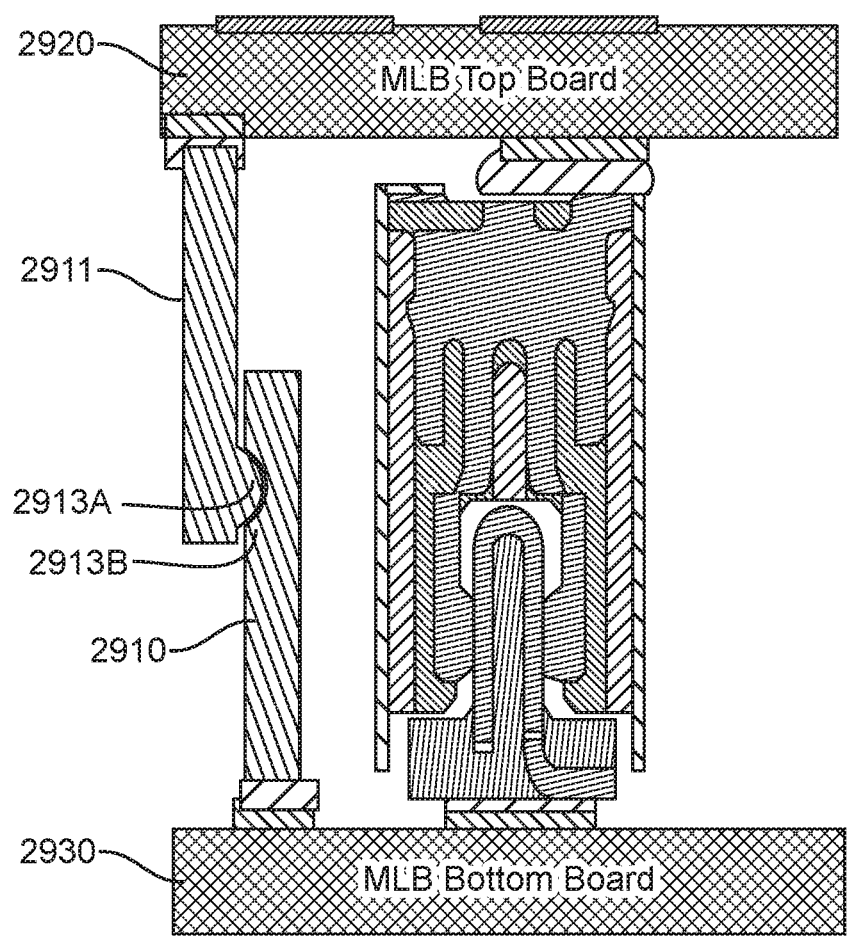
FIG. 29 illustrates a portion of a SIP module according to an embodiment of the present invention.

FIG. 29 illustrates a portion of a SIP module according to an embodiment of the present invention. In this example, the frame is formed into sections, namely bottom section 2910 which may be attached to a bottom board 2930, and top section 2911, which may be attached to a top board 2920. Bottom section 2910 and top section 2911 of the frame may be joined using interlocking features 2913. Interlocking features 2913A may include a protrusion, extension, or widened portion on top section 2913B that may fit in notch or narrowed portion on bottom section 2910.

In these and other embodiments of the present invention, various board-to-board connectors may be used. These board two board connectors may include a plug attached to a first or top printed circuit board and a receptacle attached to a second or bottom printed circuit board. The board-to-board connectors may include contacts that may be soldered to contact pads on the top printed circuit board and the bottom printed circuit board. The board-to-board connectors may to form electrical connections for signals or power between devices on the top printed circuit board and devices on the bottom printed circuit board.

For example, a first component on a top printed circuit board may connect through a trace in the top printed circuit board to a first contact pad. A first contact in a plug of a board-to-board connector may physically and electrically connect to the first contact pad. The first contact in the plug may mate with a second contact in the receptacle of the board-to-board connector. The second contact in the receptacle may physically and electrically connect to a second contact pad on the bottom board. The second contact pad on the bottom board may connect through a trace of the bottom printed circuit board to a second component on the bottom board. Examples of these board-to-board connectors are shown in the following figures.

Figure 30:
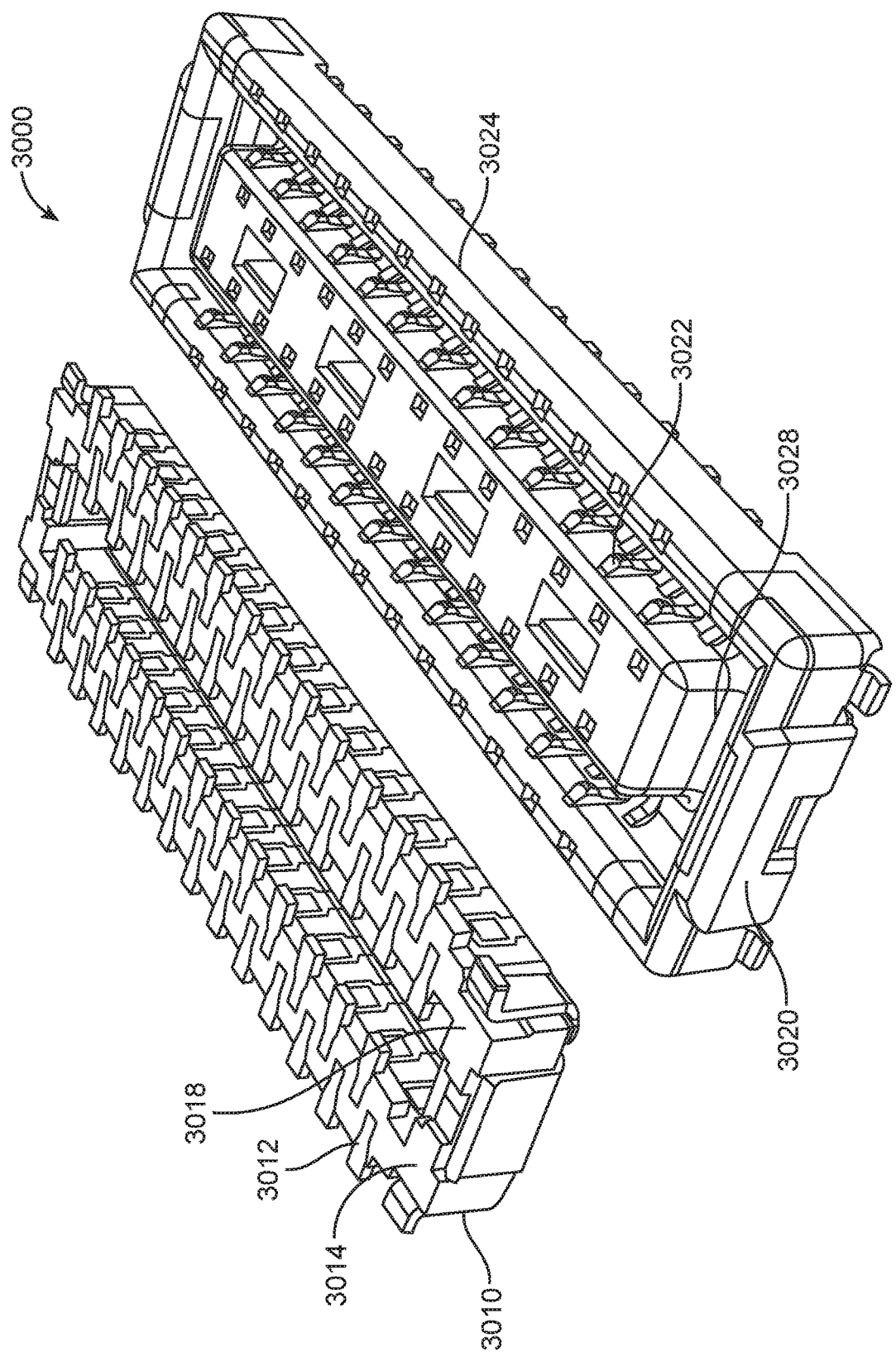
FIG. 30 illustrates a board-to-board connector according to an embodiment of the present invention.

FIG. 30 illustrates a board-to-board connector according to an embodiment of the present invention. Board-to-board connector 3000 may be used along with a frame, such as frame 2210 and the other frames shown above. Plug 3010 may include contacts 3012 supported by housing 3014. Contacts 3012 may mate with contacts 3022 in housing 3024 of receptacle 3020. Plug 3010 may include endcap 3018, while receptacle 3020 may include an opening 3028 to accept endcap 3018.

Figure 31:
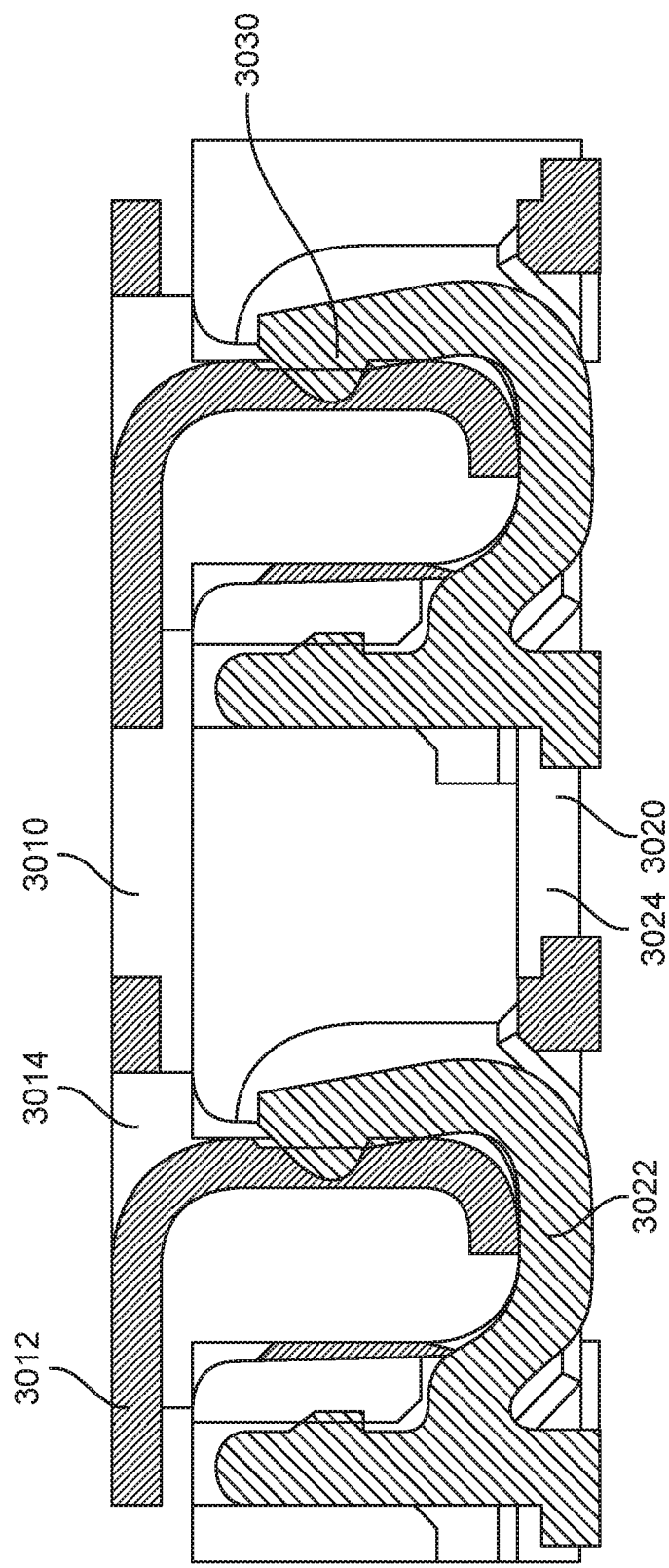
FIG. 31 illustrates a cutaway side view of the board-to-board connector of FIG. 30.

FIG. 31 illustrates a cutaway side view of the board-to-board connector of FIG. 30. In this example, contacts 3012 may be housed in housing 3014 of plug 3010. Contacts 3012 may mate with contacts 3022 which may be in housing 3024 of receptacle 3020. Contacts 3022 and 3012 may mate at location 3030. This arrangement may provide a small face-saving board-to-board connector.

In various embodiments of the present invention, it may be desirable to strengthen these board-to-board connectors. Accordingly, an endcap of a board-to-board connector may be increased in size. An example is shown in the following figure.

Figure 32:
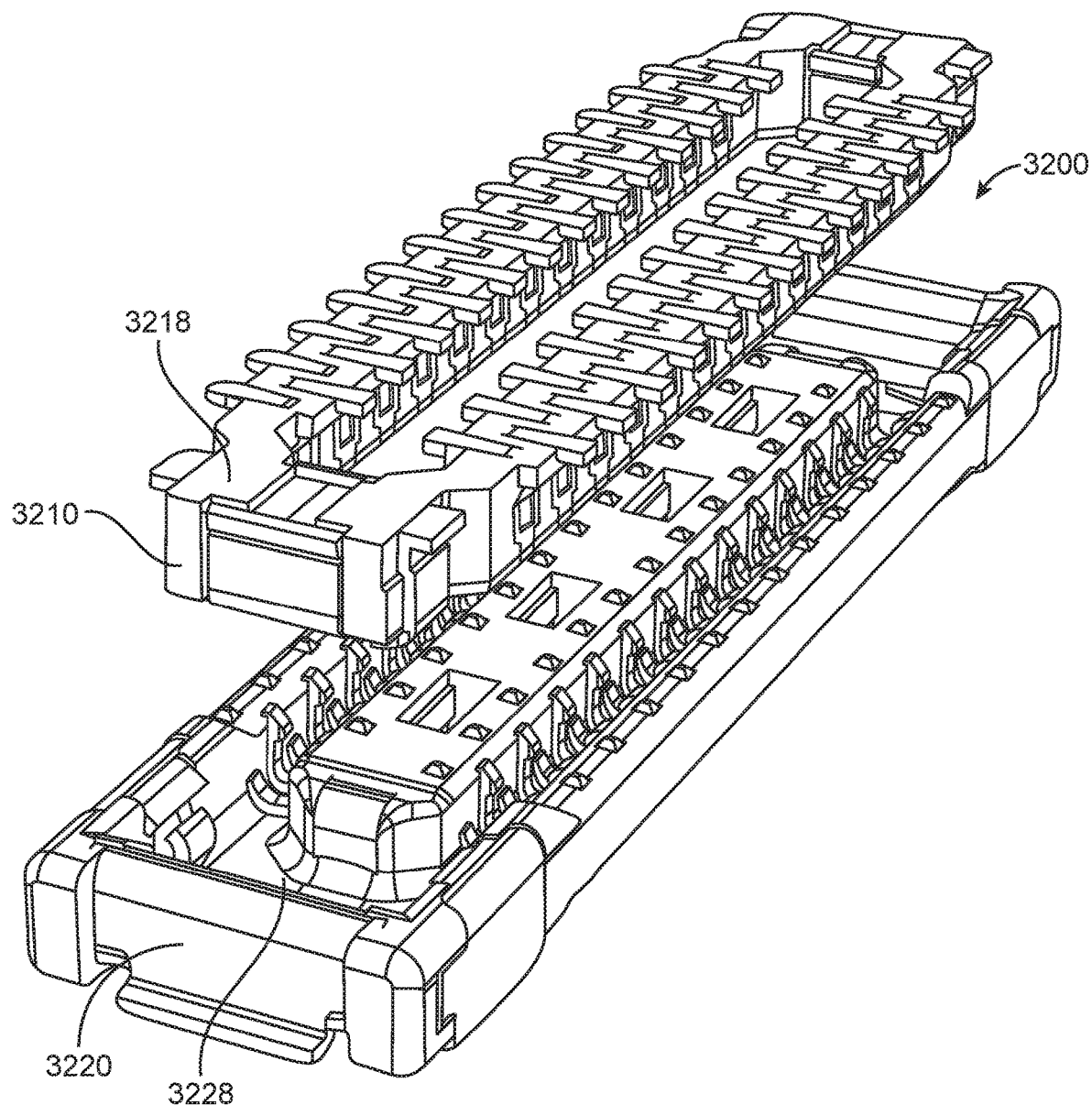
FIG. 32 illustrates another board-to-board connector according to an embodiment of the present invention.

FIG. 32 illustrates another board-to-board connector according to an embodiment of the present invention. In this example, board-to-board connectors 3200 may include a larger endcap 3218. Endcap 3218 may be larger than, for example endcap 3018 as shown in FIG. 30. Receptacle 3220 may include opening 3228 for accepting endcap 3218.

Figure 33:
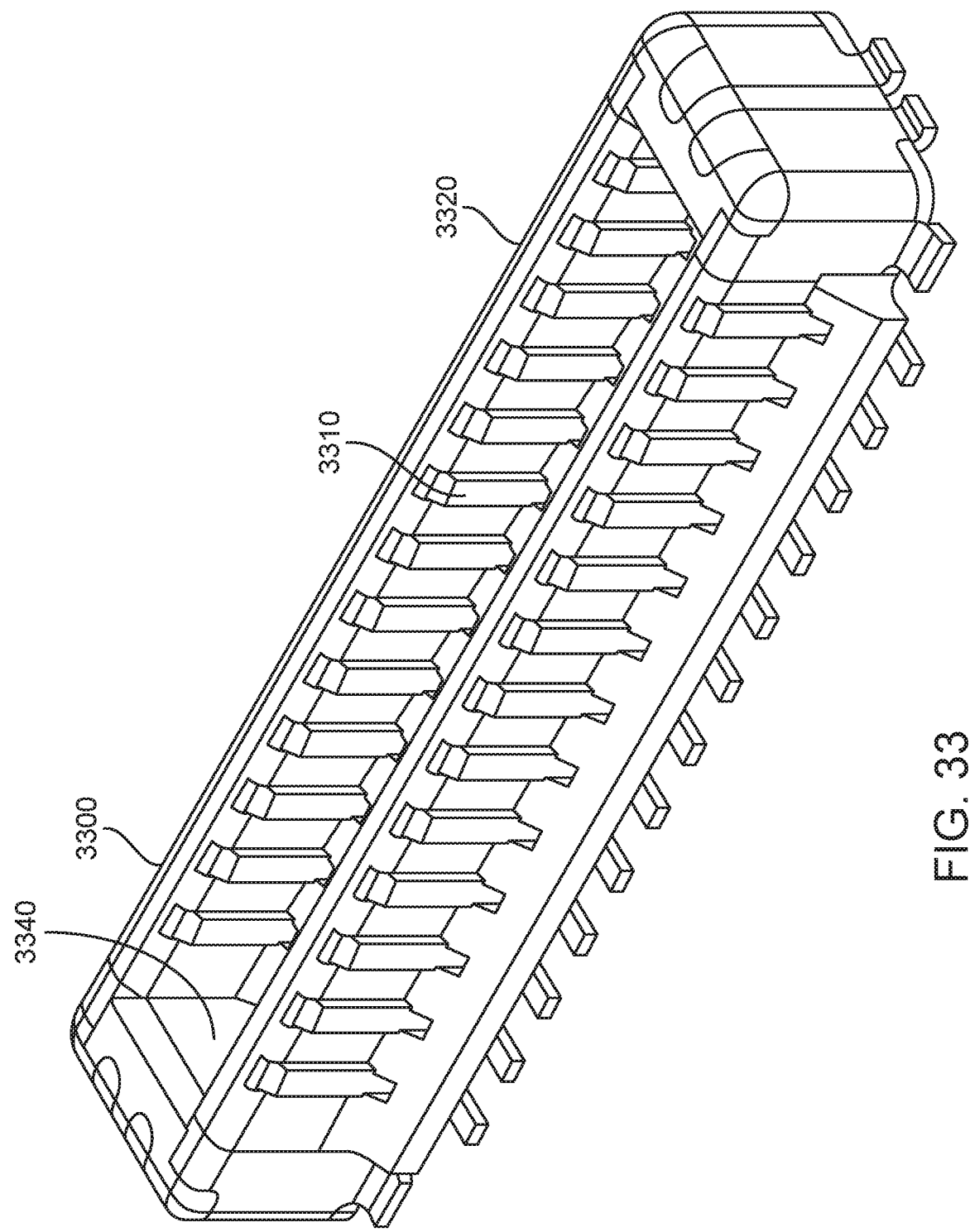
FIG. 33 illustrates a plug for a board-to-board connector according to an embodiment of the present invention.

FIG. 33 illustrates a plug for a board-to-board connector according to an embodiment of the present invention. In this example, plug 3330 may include contacts 3310 in housing 3320. Plug 3300 may mate with receptacle 3400, as shown in FIG. 34.

Figure 34:
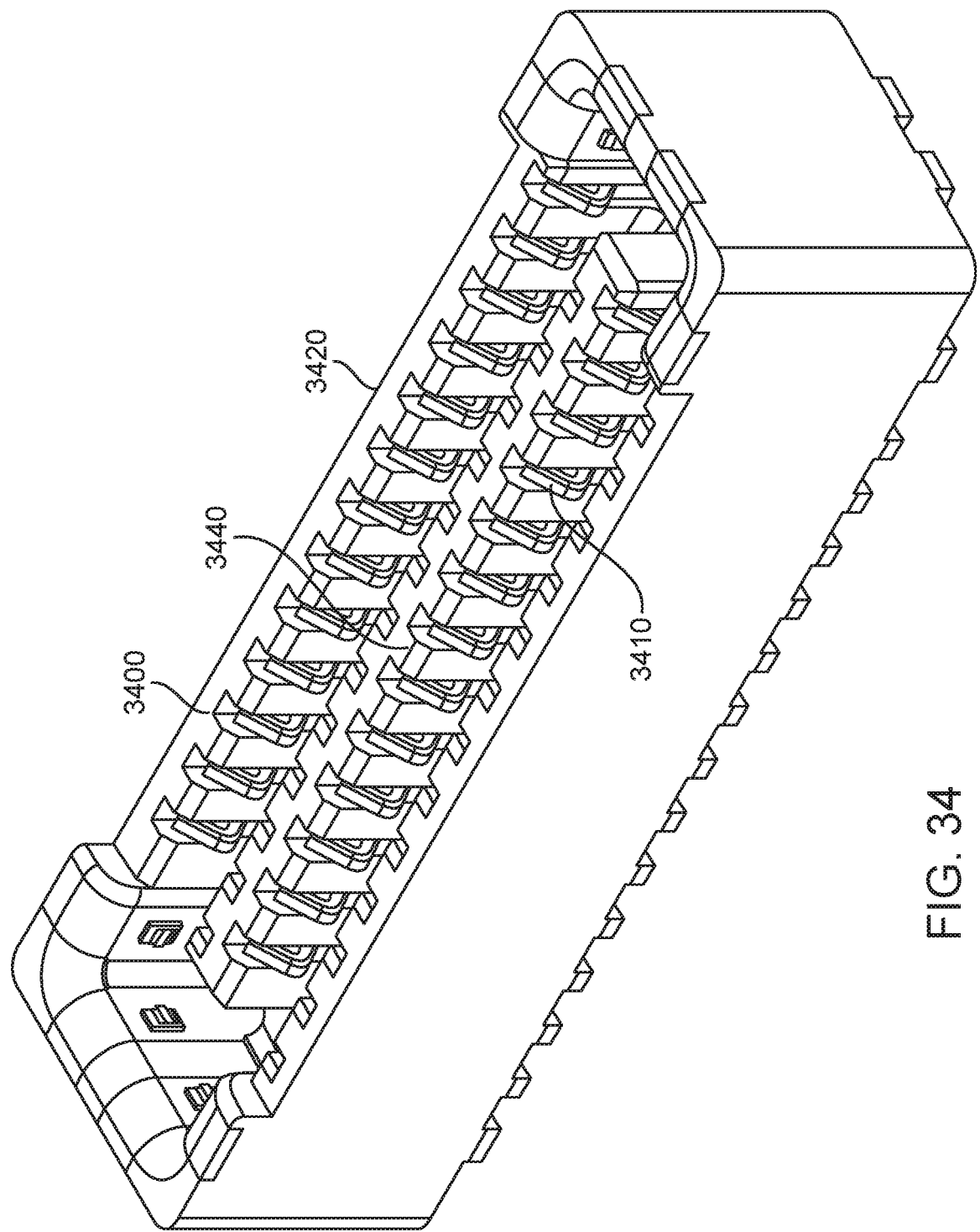
FIG. 34 illustrates a receptacle for a board-to-board connector according to an embodiment of the present invention.
Figure 35A:
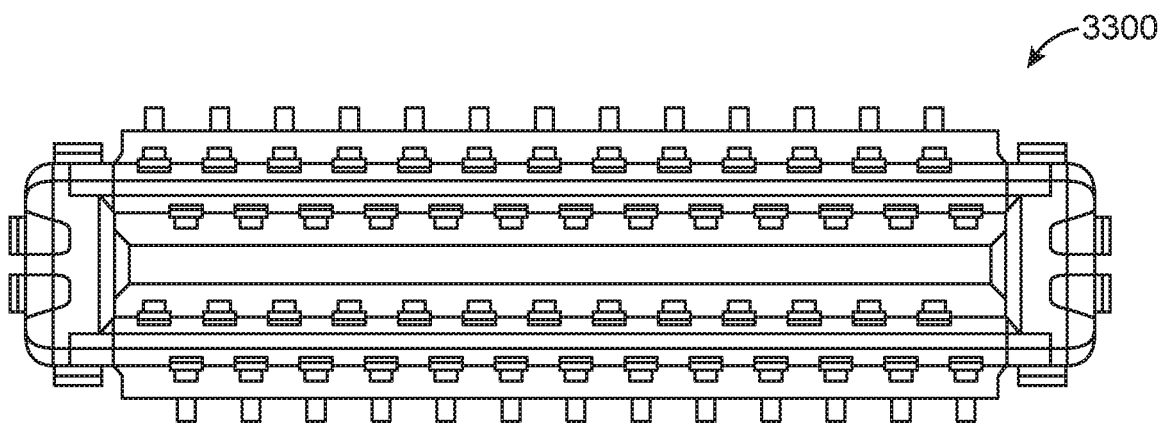
FIGS. 35A-35D illustrate the plug of FIG. 33.
Figure 35B:
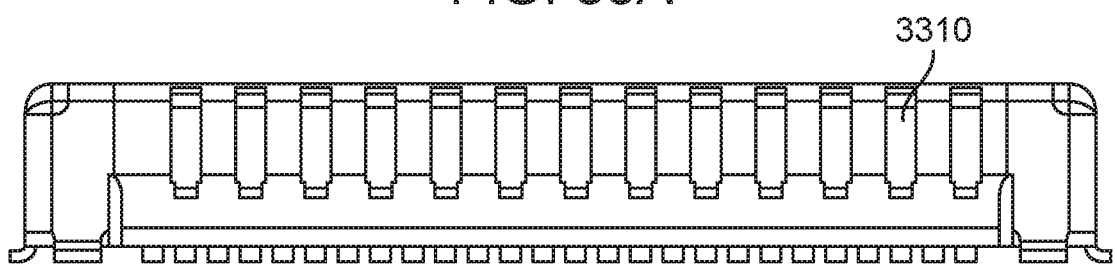
Figure 35C:
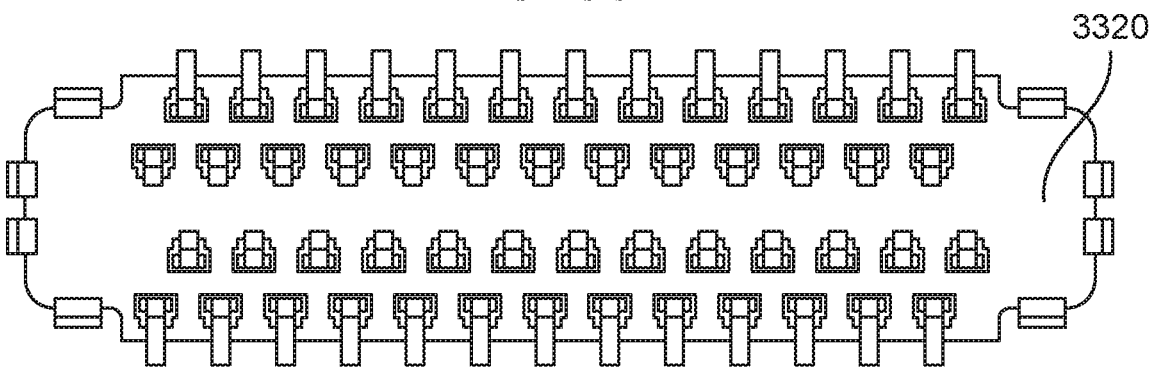
Figure 35D:
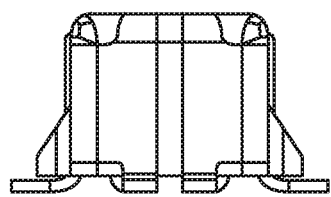

FIG. 34 illustrates a receptacle for a board-to-board connector according to an embodiment of the present invention. Receptacle 3400 may include a center portion 3440, which may fit in recess 3340 in housing 3320 of plug 3300 (shown in FIG. 33.) Central portion 3440 may be a part of housing 3420, which may support contacts 3410 in receptacle 3400.

Plug 3300 is shown in more detail in FIGS. 35A-35D. Plug 3300 may include contacts 3310 in housing 3320, as shown in FIGS. 35A-35D.

Figure 36:
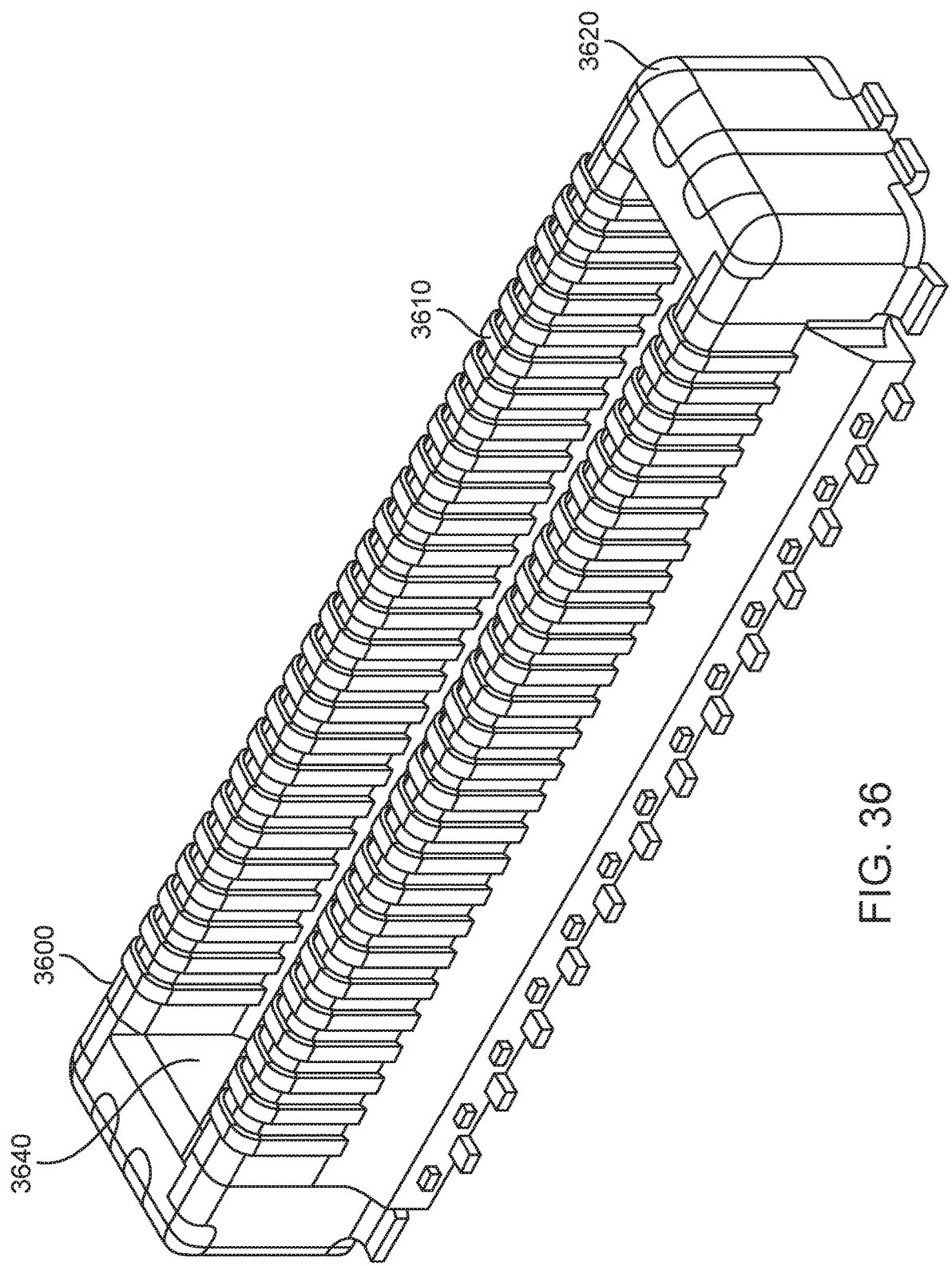
FIG. 36 illustrates another plug for a board-to-board connector according to an embodiment of the present invention.
Figure 37A:
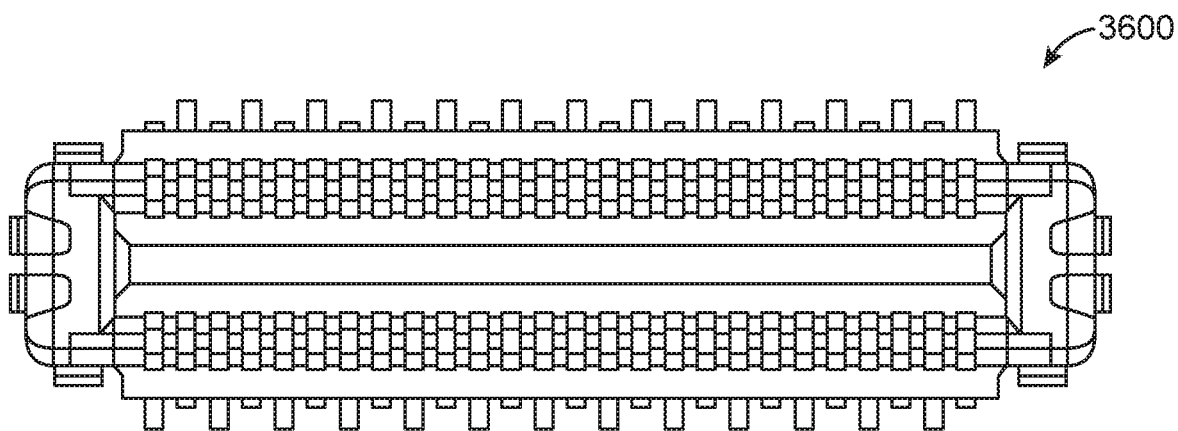
FIGS. 37A-37D illustrate the plug of FIG. 36.
Figure 37B:
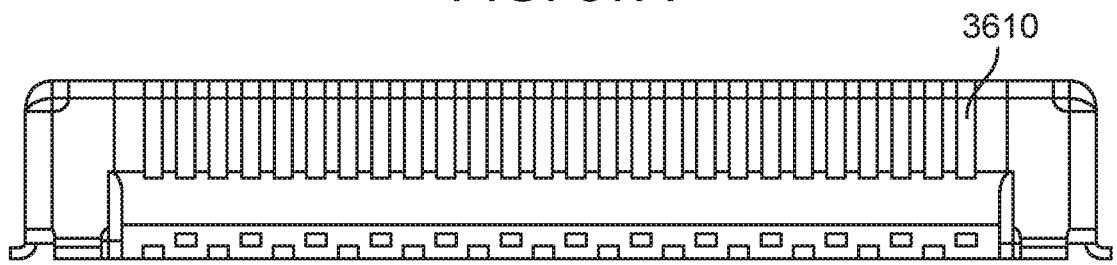
Figure 37C:
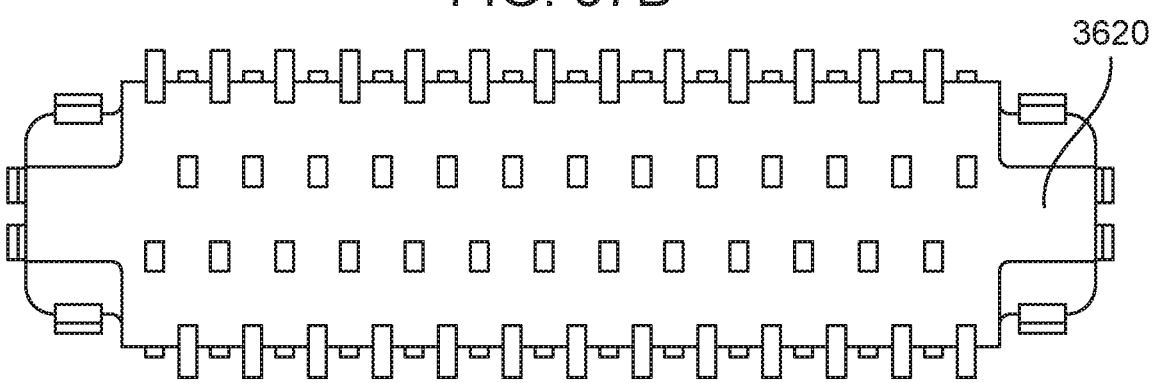
Figure 37D:
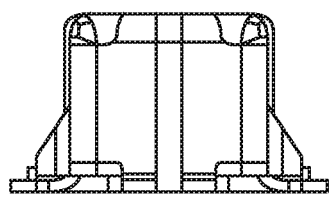

FIG. 36 illustrates another plug for a board-to-board connector according to an embodiment of the present invention. Plug 3600 may be used with a similar receptacle as receptacle 3400 shown in FIG. 34. Plug 3600 may include recess or central portion 3640, which may be lined by contacts 3610 supported by housing 3620. Various views of plug 3600 are shown in FIGS. 37A-37D. Again contacts 3610 may be supported by housing 3620, as shown in FIGS. 37A-37D.

Figure 38A:
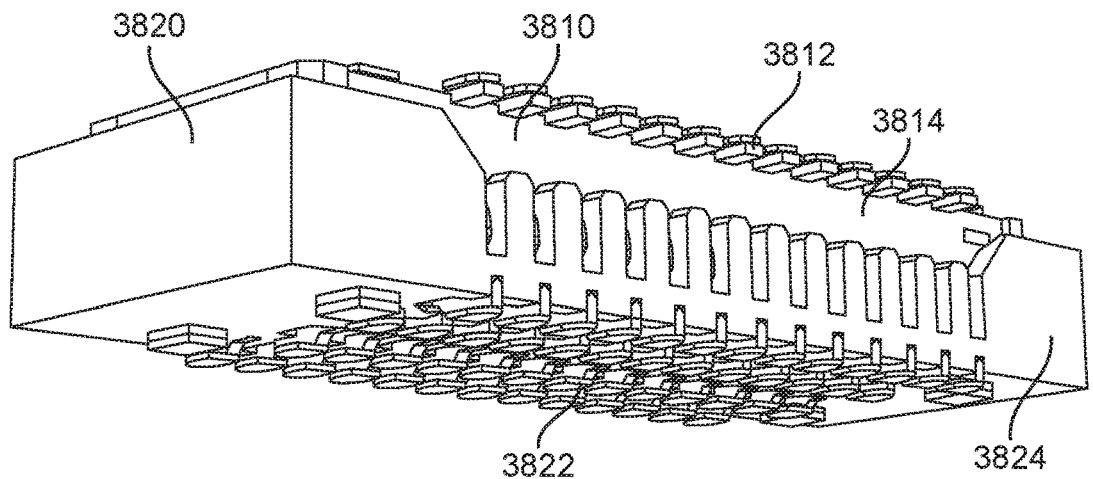
FIGS. 38A-38C illustrate another board-to-board connector according to an embodiment of the present invention
Figure 38B:
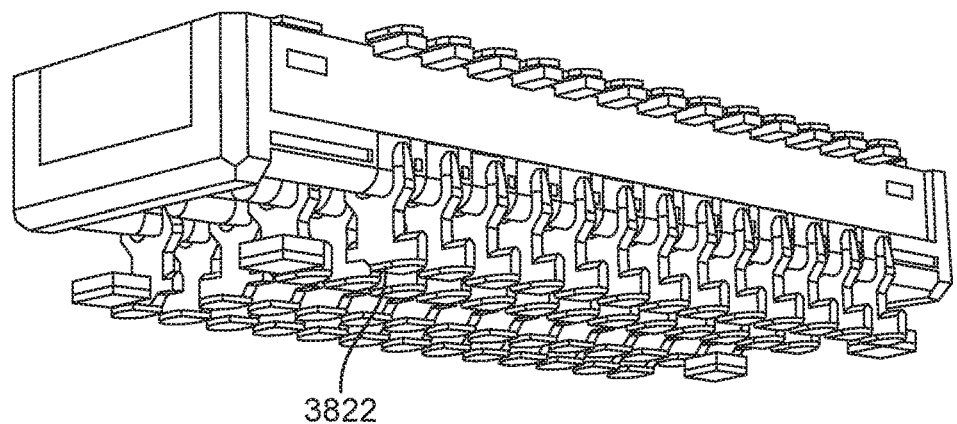
Figure 38C:
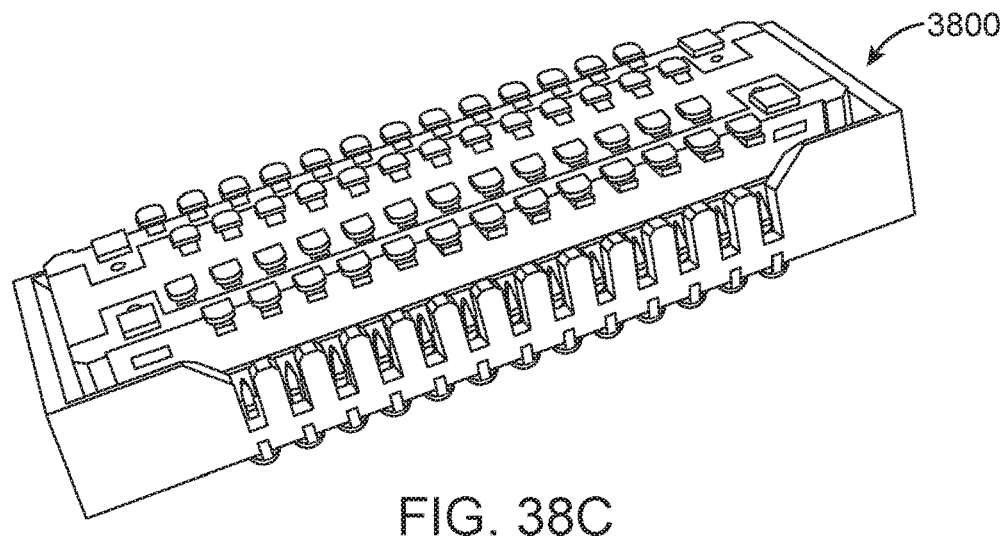

FIGS. 38A-38C illustrate another board-to-board connector according to an embodiment of the present invention. In FIG. 38A, plug 3810 may be inserted into receptacle 3820. Contacts 3812 of plug 3810 may electrically connect to contacts 3822 in receptacle 3820. Contacts 3812 may be supported by housing 3814 in plug 3810, while contacts 3822 may be supported by housing 3824 of receptacle 3820. In FIG. 38B, housing 3824 has been removed to expose contacts 3822 in receptacle 3820. FIG. 38C illustrates a bottom side view of board-to-board connector 3800.

It should be noted that while the interconnect structures described above are well-suited to forming system-in-package modules, in these other embodiments of the present invention, other types of electronic devices may be formed using these techniques.

In various embodiments of the present invention, frames, contacts, interconnect paths, and other conductive portions of SIP modules may be formed by stamping, metal-injection molding, machining, micro-machining, ink-jet, 3-D, plating, aerosol-jet, or other type of printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, ink-jet, 3-D, aerosol-jet, or other type of printing, machining, or other manufacturing process. The nonconductive portions may be formed of silicon or silicone, rubber, hard rubber, plastic, nylon, liquid-crystal polymers (LCPs), plastic, epoxy, resin, or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:
1. A system-in-package module comprising:
a top printed circuit board;

a first component and a first plurality of contact pads on a surface of the top printed circuit board;

a bottom printed circuit board;

a second component and a second plurality of contact pads on a surface of the bottom printed circuit board, where the surface of the top printed circuit board and the surface of the bottom printed circuit board are separated and face each other such that the first component and the second component are between the top printed circuit board and the bottom printed circuit board;

a frame extending as a single piece from the surface of the top printed circuit board to the surface of the bottom printed circuit board, wherein the frame is formed of metal; and a connector coupled to the first plurality of contact pads and the second plurality of contact pads to convey signals between the top printed circuit board and the bottom printed circuit board.

2. The system-in-package module of claim 1 wherein the connector is a board-to-board connector comprising:

a plug comprising a first plurality of contacts coupled to the first plurality of contact pads on the top printed circuit board; and a receptacle comprising a second plurality of contacts coupled to the second plurality of contact pads on the bottom printed circuit board.

3. The system-in-package module of claim 1 wherein the frame is a loop around the first component and the second component.

4. The system-in-package module of claim 1 wherein the connector comprises a plurality of wires attached to the second plurality of contact pads and housed in an insert molding, the frame formed on an outside surface of the insert molding.

5. The system-in-package module of claim 1 wherein a first contact pad in the first plurality of contact pads is electrically connected to the first component through a first trace on the top printed circuit board, wherein a second contact pad in the second plurality of contact pads is electrically connected to the second component through a second trace on the bottom printed circuit board, and wherein the connector includes interconnect to connect the first contact pad to the second contact pad.

6. The system-in-package module of claim 1 wherein the frame is connected to the top printed circuit board and the bottom printed circuit board and forms a ground path from the top printed circuit board to the bottom printed circuit board.

7. The system-in-package module of claim 5 wherein the frame is formed of one of copper or a copper-alloy.

8. The system-in-package module of claim 5 wherein the frame is formed by stamping.

9. The system-in-package module of claim 1 further comprising:

a high-speed signal path attached to the surface of the top printed circuit board and the surface of the bottom printed circuit board.

10. The system-in-package module of claim 9 wherein the high-speed signal path is a coaxial structure formed in an LDS frame.

11. The system-in-package module of claim 10 wherein the LDS frame is located along an edge of the bottom printed circuit board.

12. The system-in-package module of claim 11 wherein the coaxial structure comprises a central conductor, a first LDS molding around the central conductor, a shield around the first LDS molding, and the LDS frame around the shield.

13. The system-in-package module of claim 12 wherein the central conductor is a pin.

14. The system-in-package module of claim 12 wherein the central conductor is formed by plating.

15. The system-in-package module of claim 9 wherein the high-speed signal path comprises a signal pin and two ground pins in the frame and is located along an edge of the bottom printed circuit board, the two ground pins located on each side of the signal pin.

16. The system-in-package module of claim 15 wherein the high-speed signal path further comprises ground shielding on an inside edge of the frame and an outside edge of the frame.

17. The system-in-package module of claim 15 wherein the signal pin further comprises a domed-shaped conductive structure on a top surface.

18. The system-in-package module of claim 1 wherein the connector is a board-to-board connector.

* * * * *